(12) United States Patent
Nishimura et al.

(10) Patent No.: US 8,159,013 B2
(45) Date of Patent: Apr. 17, 2012

(54) SEMICONDUCTOR INTEGRATED CIRCUIT DEVICE HAVING A DUMMY METAL WIRING LINE

(75) Inventors: Hidetoshi Nishimura, Osaka (JP); Hiroyuki Shimbo, Osaka (JP); Tetsurou Toubou, Hyogo (JP); Hiroki Taniguchi, Kyoto (JP); Hisako Yoneda, Osaka (JP)

(73) Assignee: Panasonic Corporation, Osaka (JP)

( * ) Notice: Subject to any disclaimer, the term of this patent is extended or adjusted under 35 U.S.C. 154(b) by 273 days.

(21) Appl. No.: 12/524,998

(22) PCT Filed: Feb. 24, 2009

(86) PCT No.: PCT/JP2009/000799
§ 371 (c)(1), (2), (4) Date: Jul. 29, 2009

(87) PCT Pub. No.: WO2010/001506
PCT Pub. Date: Jan. 7, 2010

(65) Prior Publication Data
US 2010/0187699 A1 Jul. 29, 2010

(30) Foreign Application Priority Data
Jul. 4, 2008 (JP) .................................. 2008-176134

(51) Int. Cl.
*H01L 29/66* (2006.01)
*H01L 29/94* (2006.01)
*H01L 21/108* (2006.01)

(52) U.S. Cl. ........................ 257/296; 257/261; 257/300

(58) Field of Classification Search .................. 257/261, 257/296, 300
See application file for complete search history.

(56) References Cited

U.S. PATENT DOCUMENTS

| 5,801,407 A | 9/1998 | Yamada |
| 5,847,421 A | 12/1998 | Yamaguchi |
| 6,194,252 B1 | 2/2001 | Yamaguchi |
| 2004/0026759 A1* | 2/2004 | Nakabayashi ................ 257/499 |

(Continued)

FOREIGN PATENT DOCUMENTS

JP    10-032253 A    2/1998

(Continued)

OTHER PUBLICATIONS

Front Page of Published International Application No. PCT/JP2009/000799 filed Feb. 24, 2009.

(Continued)

*Primary Examiner* — James Mitchell
(74) *Attorney, Agent, or Firm* — McDermott Will & Emery LLP

(57) ABSTRACT

There is provided a layout structure of a semiconductor integrated circuit capable of preventing the thinning of a metal wiring line close to a cell boundary and wire breakage therein without involving increases in the amount of data for OPC correction and OPC process time. In a region interposed between a power supply line and a ground line each placed to extend in a first direction, first and second cells each having a transistor and an intra-cell line each for implementing a circuit function are placed to be adjacent to each other in the first direction. In a boundary portion between the first and second cells, a metal wiring line extending in a second direction orthogonal to the first direction is placed so as not to short-circuit the power supply line and the ground line.

17 Claims, 21 Drawing Sheets

U.S. PATENT DOCUMENTS

| | | |
|---|---|---|
| 2005/0205894 A1 | 9/2005 | Sumikawa et al. |
| 2005/0270823 A1 | 12/2005 | Nozoe et al. |
| 2007/0004147 A1 | 1/2007 | Toubou et al. |
| 2007/0111405 A1 | 5/2007 | Watanabe et al. |

FOREIGN PATENT DOCUMENTS

| | | |
|---|---|---|
| JP | 2005-268610 A | 9/2005 |
| JP | 2005-347591 A | 12/2005 |
| JP | 2006-073696 | 3/2006 |
| JP | 2007-012855 A | 1/2007 |
| JP | 2007-141971 A | 6/2007 |

OTHER PUBLICATIONS

International Search Report issued in International Patent Application No. PCT/JP2009/000799 dated May 19, 2009.

* cited by examiner

SEMICONDUCTOR INTEGRATED CIRCUIT DEVICE HAVING A DUMMY METAL WIRING LINE

RELATED APPLICATIONS

This application is the U.S. National Phase under 35 U.S.C. §371 of International Application No. PCT/JP2009/000799, filed on Feb. 24, 2009, which in turn claims the benefit of Japanese Application No. 2008-176134, filed on Jul. 4, 2008, the disclosures of which Applications are incorporated by reference herein.

TECHNICAL FIELD

The present disclosure relates to a layout structure of a semiconductor integrated circuit which is effective in improving the dimensional precision of a wiring pattern.

BACKGROUND ART

As design rules have been increasingly reduced with miniaturization, variation in line width due to an optical proximity effect has become ignorable. The optical proximity effect is a phenomenon in which a finished value of a line width varies according to a distance to a proximate line. The optical proximity effect degrades the dimensional precision of wiring. Accordingly, depending on a line-to-line space, the line width is reduced to a value smaller than a specified value under the influence of the optical proximity effect and, in some cases, may result in wire breakage.

Therefore, it is essential to compensate for the influence of the optical proximity effect by OPC (Optical Proximity effect Correction). The OPC is a technique which predicts an amount of variation in line width resulting from the line-to-line space, performs correction so as to offset the amount of variation, and holds a finished line width constant.

For example, as a method for preventing variation in the line width of polysilicon wiring, the technology disclosed in Patent Literature 1.
Patent Literature 1: Japanese Laid-Open Patent Publication No. H 10-32253 has been known.

SUMMARY

Problems that the Invention is to Solve

In the design of a semiconductor integrated circuit, layout design is typically performed by placing standard cells included in a library. In this case, a distance to a proximate line from a metal wiring line closest to the cell boundary of a given cell differs depending on a layout structure of cells placed in adjacent relation.

Accordingly, for the metal wiring line closest to the cell boundary, it is necessary to perform OPC correction after placing a cell, and then determining the distance from the metal wiring line to a proximate line. Unless the OPC correction is thus performed, line thinning due to the optical proximity effect occurs in the metal wiring line closest to the cell boundary to increase the possibility of wire breakage, particularly in a 65 nm or smaller design rule process. When the OPC correction is performed after cell placement, the problems of an increased amount of data for OPC correction, and a longer OPC process time occur.

It is therefore an object of the present invention to provide a layout structure of a semiconductor integrated circuit capable of preventing the thinning of a metal wiring line close to a cell boundary and wire breakage therein without involving increases in the amount of data for OPC correction and OPC process time.

Means for Solving the Problems

The present invention is a semiconductor integrated circuit device including: a power supply line and a ground line each placed to extend in a first direction; and first and second cells placed in a region interposed between the power supply line and the ground line to be adjacent to each other in the first direction, and each having a transistor and an intra-cell line each for implementing a circuit function, wherein a metal wiring line extending in a second direction orthogonal to the first direction is placed in a boundary portion between the first and second cells so as not to short-circuit the power supply line and the ground line.

In accordance with the present invention, the metal wiring line is placed in the boundary portion between the first and second adjacent cells so as not to short-circuit the power supply line and the ground line. Accordingly, before a cell is placed, a distance to a proximate line from the intra-cell line closest to the boundary portion is determined within the cell. Therefore, it is possible to predict the magnitude of variation in line width due to the optical proximity effect, and perform OPC correction with respect to standard cells before cell placement. As a result, the OPC correction after cell placement is no more necessary. This allows reductions in the amount of data for OPC correction and OPC process time, and also allows a reduction in the number of development steps.

ADVANTAGES

Thus, in accordance with the present invention, it is possible to prevent the thinning of the metal wiring line closest to the cell boundary, and wire breakage therein without involving increases in the amount of data for OPC correction and OPC process time.

DESCRIPTION OF CHARACTERS m1 power supply line
m2 ground line
m3 to m8 intra-cell line
P1 to P3 PMOS transistors
N1 to N3 NMOS transistor
d2, d22, d32 metal wiring line
d8 metal wiring line (first wiring)
d9 metal wiring line (second wiring)
d41 to d44 a plurality of small sections constituting metal wiring
d45 to d48 a plurality of small sections constituting metal wiring
d51 to d54 a plurality of small sections constituting metal wiring

BEST MODE FOR CARRYING OUT THE INVENTION

Hereinbelow, example embodiments of the present invention will be described with reference to the accompanying drawings.

(Embodiment 1)

Figure 1:
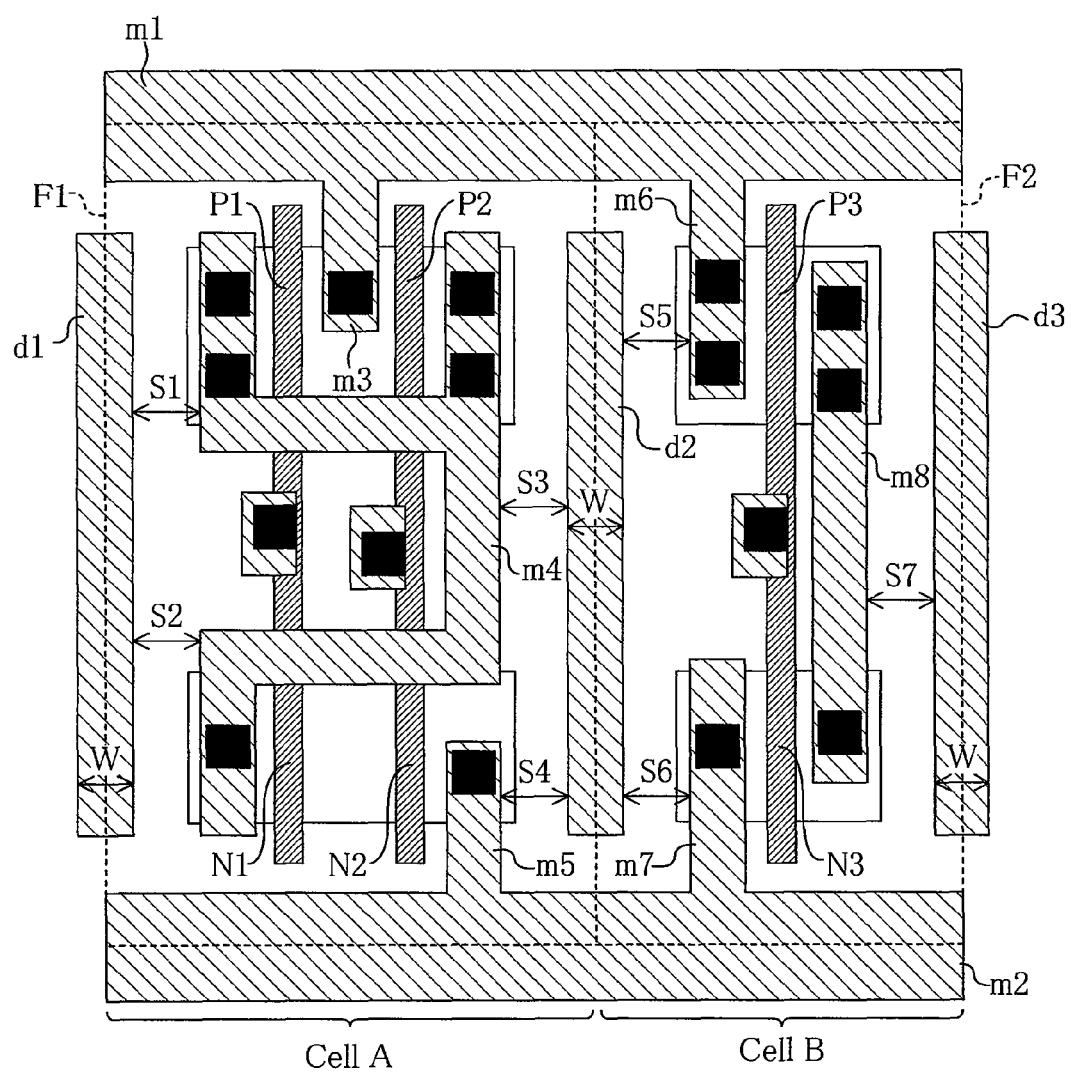
FIG. 1 is a layout plan view showing a structure of a semiconductor integrated circuit device according to a first embodiment.

FIG. 1 is a layout plan view showing a structure of a semiconductor integrated circuit device according to a first embodiment. In FIG. 1, a power supply line m1 and a ground line m2 are placed to extend in a first direction (transverse direction in the drawing). In the region interposed between the power supply line m1 and the ground line m2, a cell A as a first cell and a cell B as a second cell are placed to be adjacent to each other in the first direction.

Each of the cells A and B has a transistor and an intra-cell line each for implementing a circuit function. In this structure, the cell A forms a 2-input NAND gate, and the cell B forms an inverter.

That is, in the cell A, PMOS transistors P1 and P2 and NMOS transistors N1 and N2 are disposed. The PMOS transistors P1 and P2 have a shared source, to which a power supply voltage is supplied via a metal wiring line m3 extracted from the power supply line m1. On the other hand, the PMOS transistors P1 and P2 have respective drains connected by a metal wiring line m4, and further connected to the drain of the NMOS transistor N1. The metal wiring line m4 forms an output of the cell A. The NMOS transistor N2 has a source fixed to a ground voltage by a metal wiring line m5 extracted from the ground line m2.

In the cell B, a PMOS transistor P3 and an NMOS transistor N3 are disposed. The PMOS transistor P3 has a source to which the power supply voltage is supplied via a metal wiring line m6 extracted from the power supply line m1. On the other hand, the PMOS transistor P3 and the NMOS transistor N3 have respective drains connected by a metal wiring line m8. The meal wire m8 forms an output of the cell B. The NMOS transistor N3 has a source fixed to the ground voltage by a line m7 extracted from the ground line m2.

The power supply line m1, the ground line m2, and the intra-cell lines m3 to m8 are formed in the same wiring layer.

In the structure of FIG. 1, a metal wiring line d2 extending in a second direction (vertical direction in the drawing) orthogonal to the first direction is placed in a boundary portion between the cells A and B so as not to short-circuit the power supply line m1 and the ground line m2. The metal wiring line d2 is formed in the same wiring layer in which the power supply line m1, the ground line m2, and the intra-cell lines m3 to m8 are formed. The metal wiring line d2 is a dummy line in a floating state which is not connected to any of the power supply line m1, the ground line m2, and the intra-cell lines m3 to m8. The line width of the metal wiring line d2 is W, and the center line thereof corresponds to the cell frame F1 of the cell A and to the cell frame F2 of the cell B.

Since the metal wiring line d2 is placed in the boundary portion between the cells A and B, a distance to a proximate line region from a line region closest to the boundary portion, i.e., from a line region having no other line region between itself and the boundary portion or a line-to-line space is determined irrespective of the structure of an adjacent cell. That is, in the cell A, a line-to-line space S3 is determined for a region where a portion (portion connected to the drain of the PMOS transistor P2) of the metal wiring line m4 is placed, and a line-to-line space S4 is determined for the metal wiring line m5. In the cell B, a line-to-line space S5 is determined for the metal wiring line m6, and a line-to-line space S6 is determined for the metal wiring line m7.

Thus, in the case where the cells A and B are placed in adjacent relation, the placement of the metal wiring line d2 in the boundary portion therebetween determines the line-to-line space for the line region closest to the boundary portion, irrespective of the structure of an adjacent cell. In other words, the metal wiring lines m4 and m5 within the cell A and the metal wiring lines m6 and m7 within the cell B do not affect each other in terms of an optical proximity effect. As a result, it is sufficient to perform OPC correction for correcting a line width only with respect to each individual cell, and it is unnecessary to perform OPC correction again for compensating for influence from an adjacent cell after cell placement. As a result, it is possible to prevent the thinning of the metal wiring line closest to a cell boundary and wire breakage therein without involving increases in the amount of data for OPC correction and OPC process time.

In the structure of FIG. 1, the metal wiring lines d1 and d3 are placed even in the respective boundary portions of the cells A and B on the side opposite to the boundary portion where the metal wiring line d2 is placed. The metal wiring lines d1 and d3 are also formed in the same wiring layer in which the power supply line m1, the ground line m2, and the intra-cell lines m3 to m8 are formed. The metal wiring lines d1 and d3 are dummy lines in a floating state which are not connected to any of the power supply line m1, the ground line m2, and the intra-cell lines m3 to m8. The line width of each of the metal wiring lines d1 and d3 is W, and the center lines thereof respectively correspond to the cell frame F1 of the cell A and the cell frame F2 of the cell B.

In the cell A, the presence of the metal wiring line d1 determines the line-to-line spaces S1 and S2 for regions where portions (portions connected to the respective drains of the PMOS transistor P1 and the NMOS transistor N1) of the metal wiring line m4 are placed. In the cell B, the presence of the metal wiring line d3 determines the line-to-line space S7 for the metal wiring line m8. Therefore, the same effect as described above with respect to the metal wiring line d2 is achieved by the metal wiring lines d1 and d3.

Figure 2:
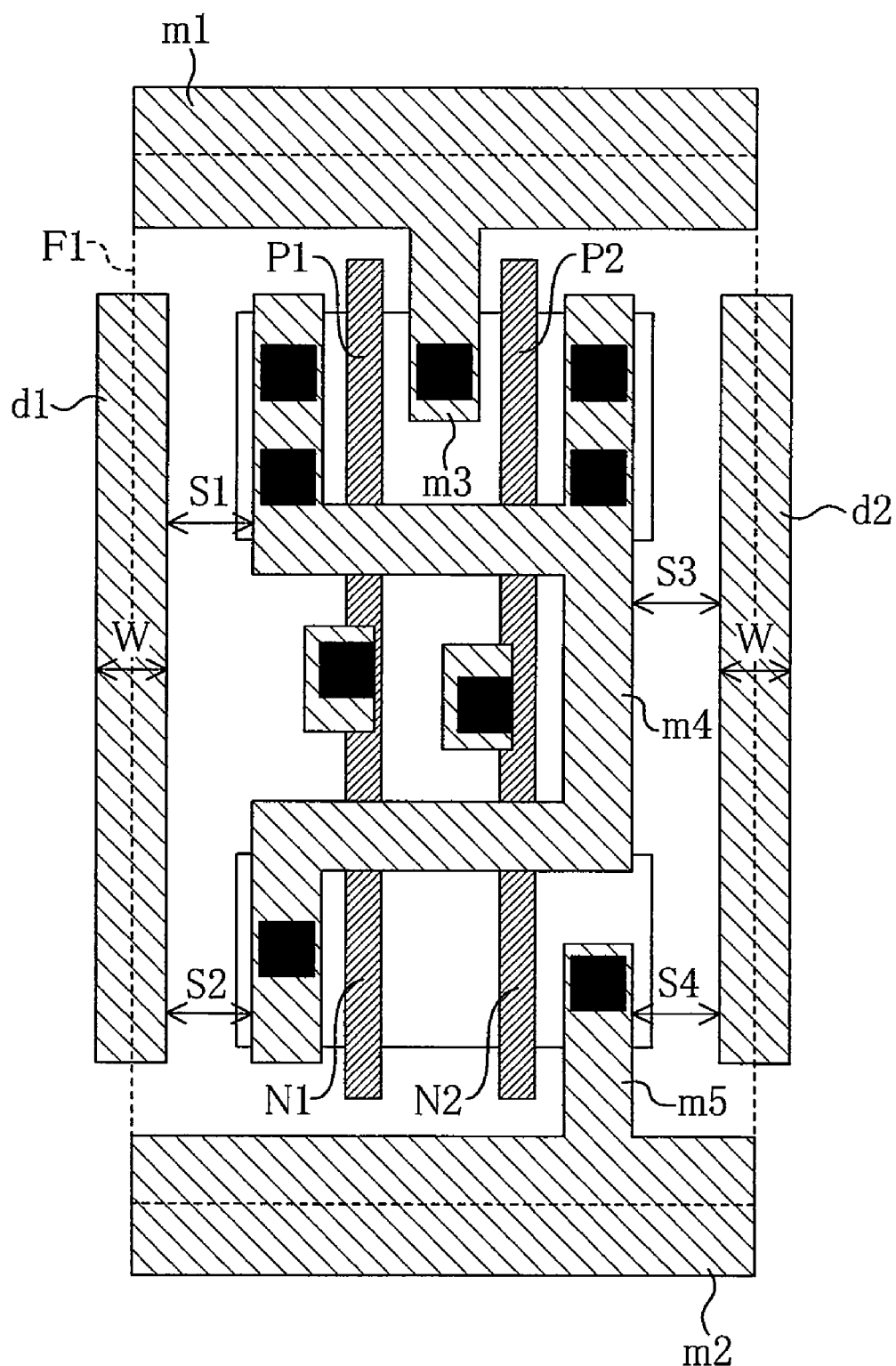
FIG. 2 is a view showing a structure of a standard cell for obtaining the layout of FIG. 1.

FIG. 2 is a view showing a structure of the cell A for obtaining the layout structure of FIG. 1. In the cell A shown in FIG. 2, the metal wiring lines d1 and d2 are placed over the cell frame F1. In the case of a cell as shown in FIG. 2, the metal wiring lines d1 and d2 are shared by adjacent cells.

Figure 3:
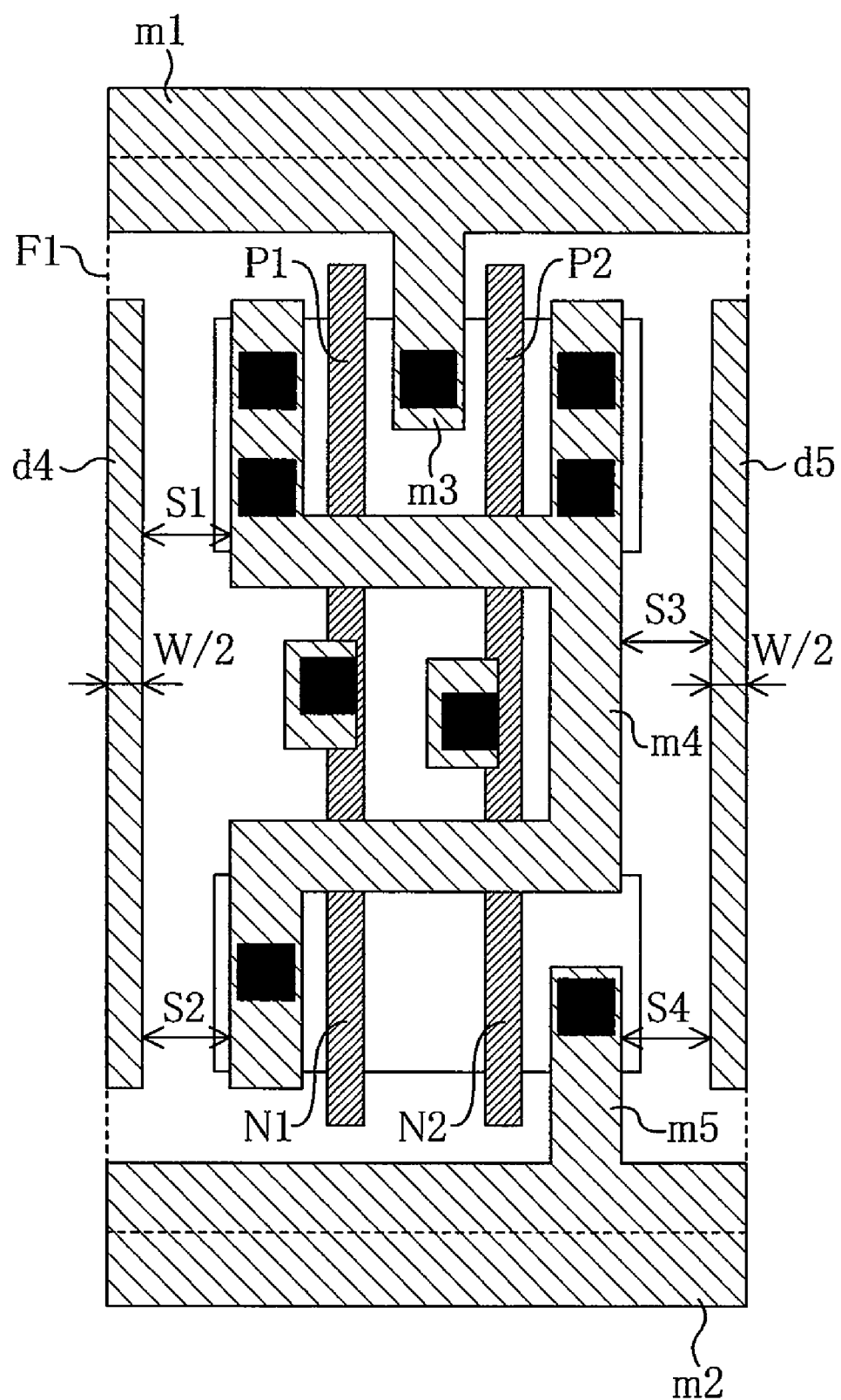
FIG. 3 is a view showing another structure of the standard cell for obtaining the layout of FIG. 1.

FIG. 3 is a view showing another structure of the cell A for obtaining the layout structure of FIG. 1. In the cell A shown in FIG. 3, metal wiring lines d4 and d5 each having a shape obtained by omitting, from the metal wiring lines d1 and d2, the portions thereof located outside the cell frame F1 in FIG. 2 are placed. The line width of each of the metal wiring lines d4 and d5 is W/2. By placing a cell as shown in FIG. 3 in adjacent relation to cells each having the same structure, metal wiring lines each having the line width W are placed in the boundary portions between the individual cells.

Figure 4:
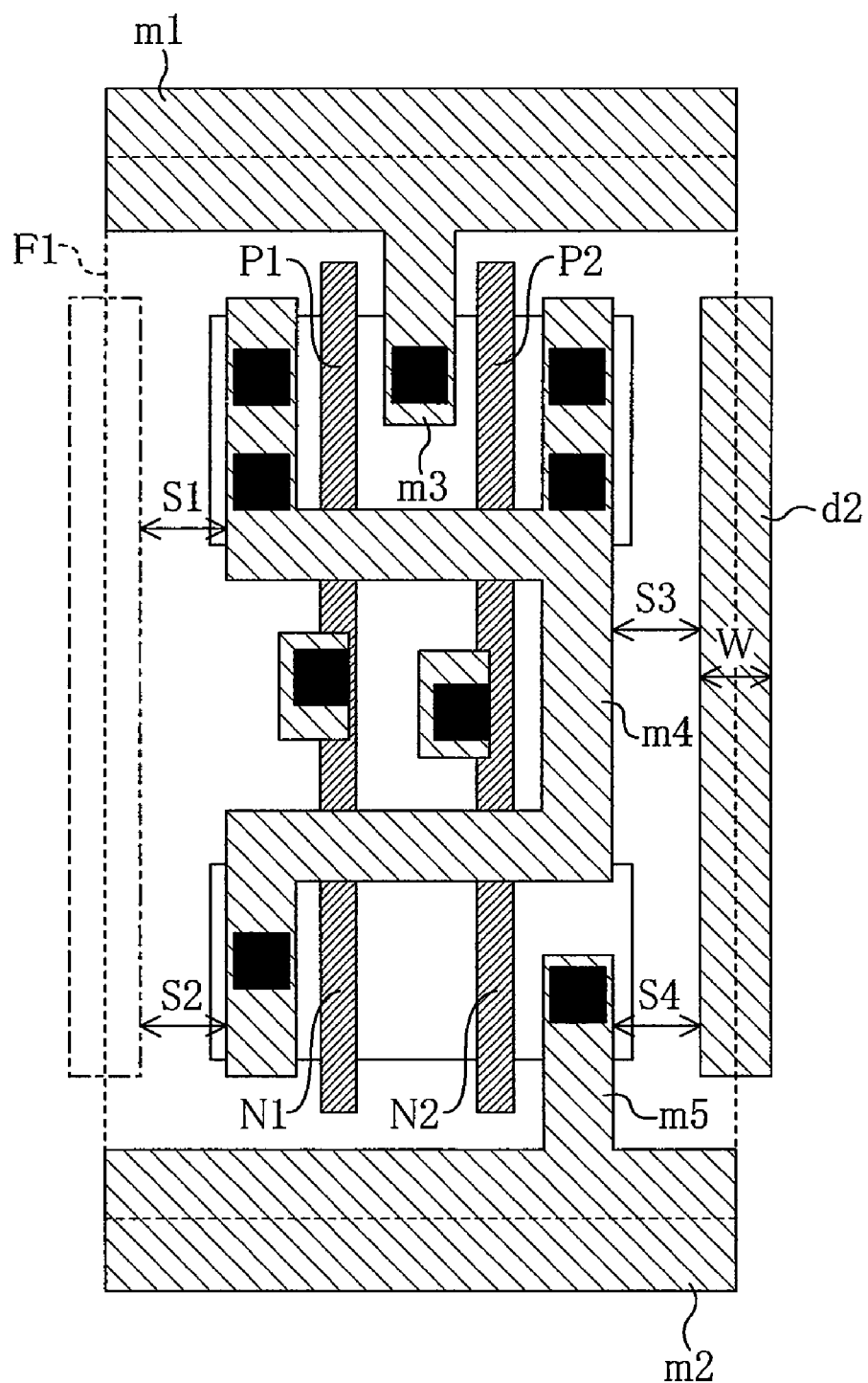
FIG. 4 is a view showing still another structure of the standard cell for obtaining the layout of FIG. 1.

FIG. 4 is a view showing still another structure of the cell A for obtaining the layout structure of FIG. 1. In the cell A shown in FIG. 4, the metal wiring line d1 in FIG. 2 is omitted, and only the metal wiring line d2 is placed. By placing a cell as shown in FIG. 4 in adjacent relation to a cell having the same structure, the metal wiring lines are placed in the boundary portions on both sides of the cell.

Figure 5:
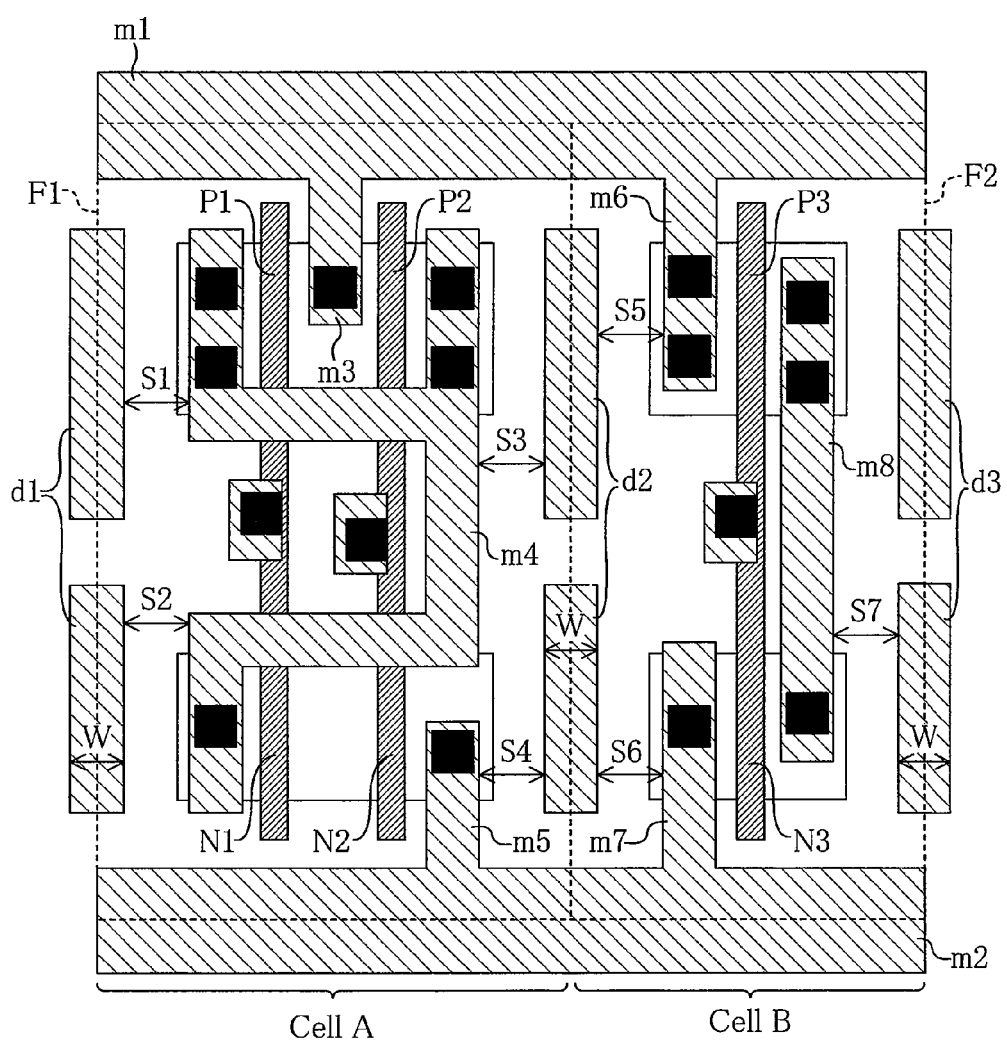
FIG. 5 is a layout plan view showing a variation of the semiconductor integrated circuit device according to the first embodiment.
Figure 6:
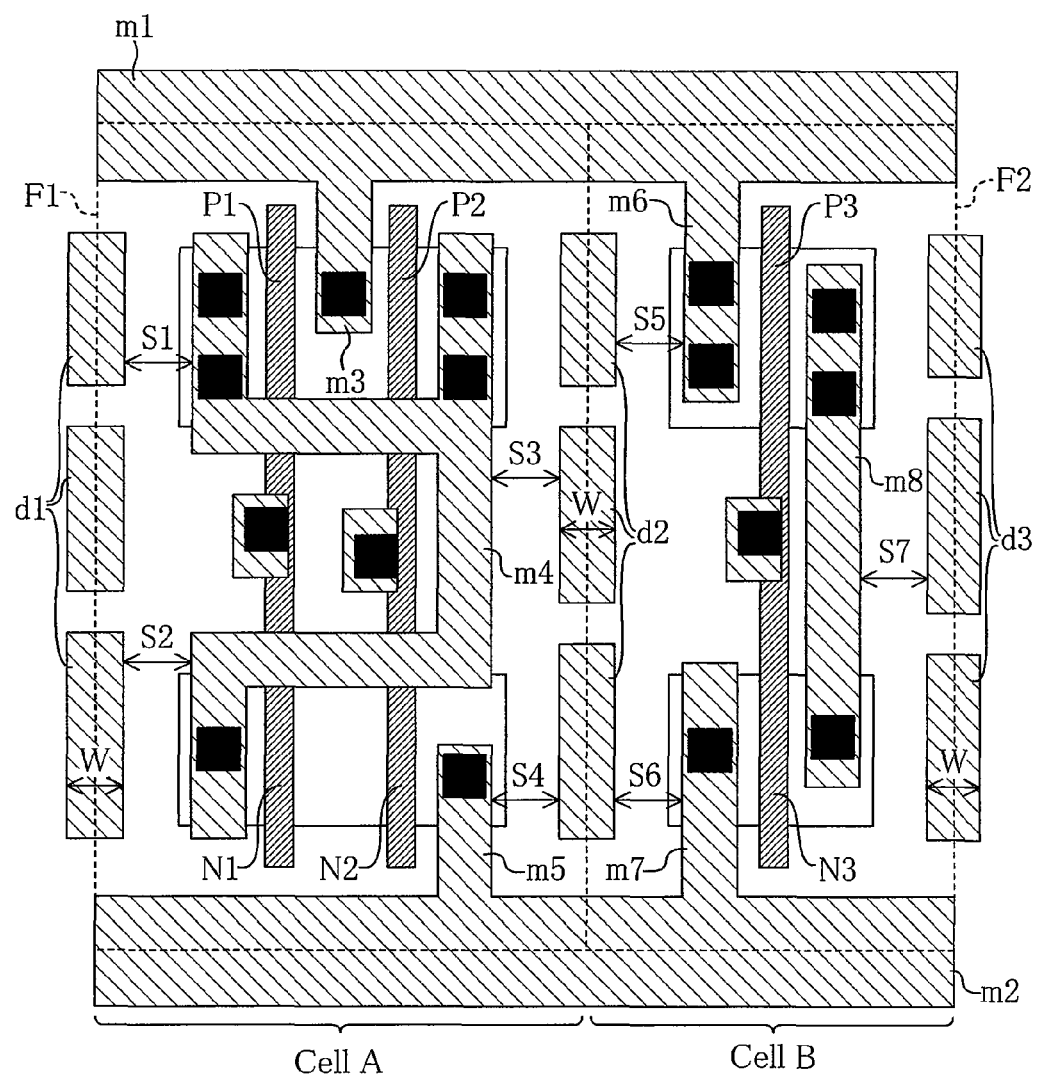
FIG. 6 is a layout plan view showing another variation of the semiconductor integrated circuit device according to the first embodiment.

The metal wiring line placed in the boundary portion between the cells need not be a single line, and may also be composed of a plurality of small sections. For example, in the example shown in FIG. 5, each of the metal wiring lines d1, d2, and d3 is composed of two sections. In the example shown in FIG. 6, each of the metal wiring lines d1, d2, and d3 is composed of three sections. The space between the individual sections preferably has a small dimension which allows the small sections to be regarded as being substantially connected in terms of the optical proximity effect, but may also be larger than the dimension. In each of the examples shown in FIGS. 5 and 6, the metal wiring lines placed in the respective boundary portions are each composed of the same number of small sections, and the spaces therebetween are substantially at the same position. However, the numbers of the small sections composing the metal lines, and the positions of the spaces therebetween may also be different from each other.

(Embodiment 2)

Figure 7:
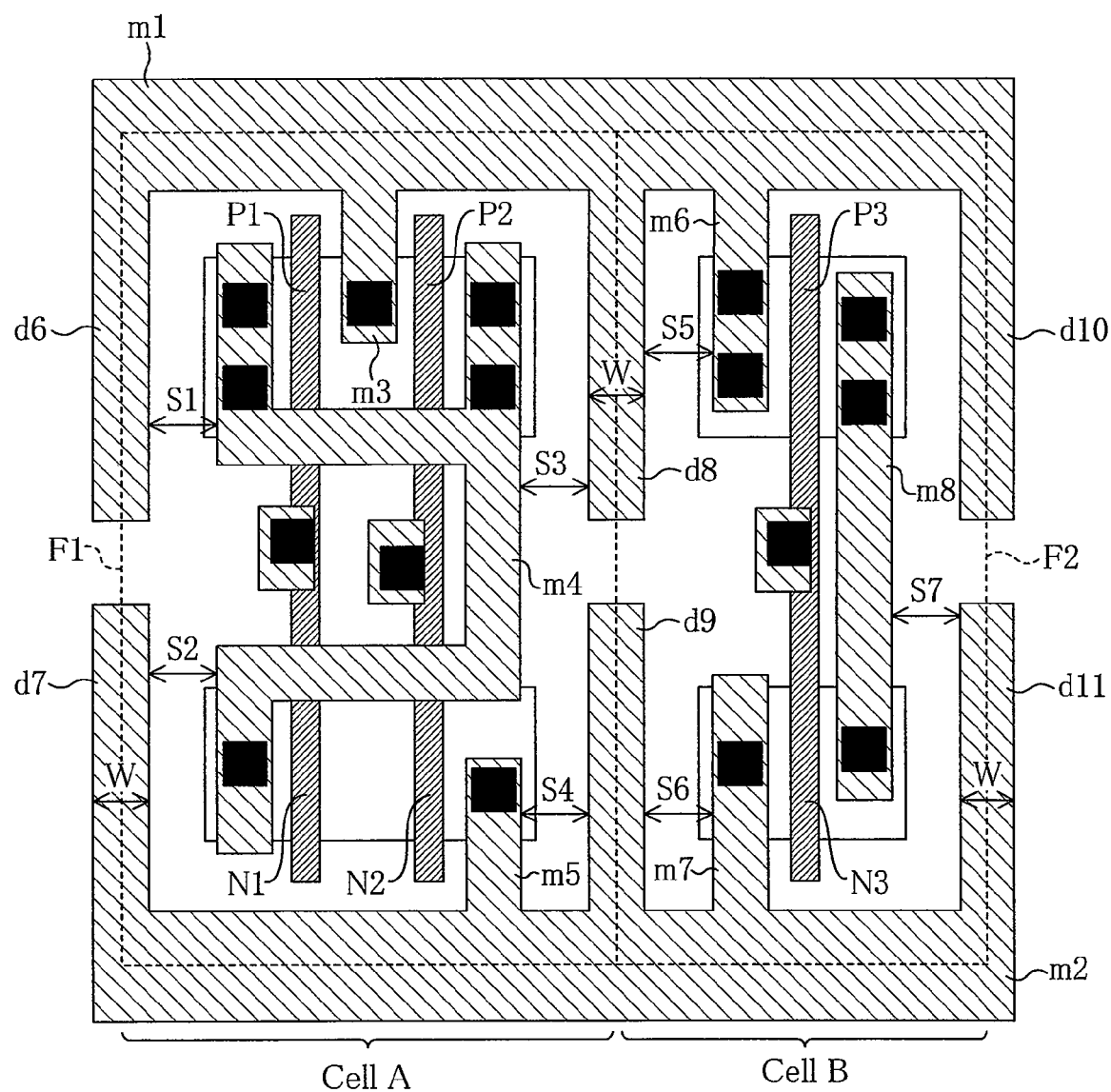
FIG. 7 is a layout plan view showing a structure of a semiconductor integrated circuit device according to a second embodiment.

FIG. 7 is a layout plan view showing a structure of a semiconductor integrated circuit device according to a second embodiment. In FIG. 7, the structures of the power supply line m1, the ground line m2, and the cells A and B are the same as in FIG. 1. Components common to those shown in FIG. 1 are provided with the same reference numerals as used in FIG. 1, and a detailed description thereof is omitted herein.

In the structure of FIG. 7, metal wiring lines d8 and d9 each extending in the second direction (vertical direction in the drawing) orthogonal to the first direction are placed so as not to short-circuit the power supply line m1 and the ground line m2. That is, the metal wiring line d8 as the first line is formed to protrude from the power supply line m1, while the metal wiring line d9 as the second line is formed to protrude from the ground line m2. The metal wiring lines d8 and d9 are not connected to each other. The metal wiring lines d8 and d9 are formed in the same wiring layer in which the power supply line m1, the ground line m2, and the intra-cell lines m3 to m8 are formed. The line width of each of the metal wiring lines d8 and d9 is W, and the center line thereof corresponds to the cell frame F1 of the cell A and to the cell frame F2 of the cell B.

Since the metal wiring lines d8 and d9 are placed in the boundary portion between the cells A and B, a distance to a proximate line region from a line region closest to the boundary portion, i.e., from a line region having no other line region between itself and the boundary portion is determined irrespective of the structure of an adjacent cell. That is, in the cell A, the line-to-line space S3 is determined for a region where a portion (portion connected to the drain of the PMOS transistor P2) of the metal wiring line m4 is placed, and the line-to-line space S4 is determined for the metal wiring line m5. In the cell B, the line-to-line space S5 is determined for the metal wiring line m6, and the line-to-line space S6 is determined for the metal wiring line m7.

Thus, in the case where the cells A and B are placed in adjacent relation, the placement of the metal wiring lines d8 and d9 in the boundary portion therebetween determines the line-to-line space for the line region closest to the boundary portion, irrespective of the structure of an adjacent cell. In other words, the metal wiring lines m4 and m5 within the cell A and the metal wiring lines m6 and m7 within the cell B do not affect each other in terms of the optical proximity effect. As a result, in the same manner as in the first embodiment, it is sufficient to perform OPC correction for correcting a line width only with respect to each individual cell, and it is unnecessary to perform OPC correction again for compensating for influence from an adjacent cell after cell placement. As a result, it is possible to prevent the thinning of the metal wiring line closest to a cell boundary and wire breakage therein without involving increases in the amount of data for OPC correction and OPC process time.

Additionally, in the present embodiment, the metal wiring lines d8 and d9 placed in the boundary portion between the cells are connected to the power supply line m1 and the ground line m2, respectively, so that the potentials of the metal wiring lines d8 and d9 are fixed. As a result, each of the metal wiring lines d8 and d9 performs the function of a so-called shield. This allows a reduction in the influence of cross-talk from an adjacent cell.

In the structure of FIG. 7, metal wiring lines d6 and d7 and metal wiring lines d10 and d11 are placed even in the respective boundary portions of the cells A and B on the side opposite to the boundary portion where the metal wiring lines d8 and d9 are placed. The metal wiring lines d6 and d10 are each formed to protrude from the power supply line m1, while the meal wiring lines d7 and d11 are each formed to protrude from the ground line m2. The metal wiring lines d6, d7, d10 and d11 are also formed in the same wiring layer in which the power supply line m1, the ground line m2, and the intra-cell lines m3 to m8 are formed. The line width of each of the metal wiring lines d6, d7, d10, and d11 is W, and the center lines thereof respectively correspond to the cell frame F1 of the cell A and the cell frame F2 of the cell B.

In the cell A, the presence of the metal wiring lines d6 and d7 determines the line-to-line spaces S1 and S2 for regions where portions (portions connected to the respective drains of the PMOS transistor P1 and the NMOS transistor N1) of the metal wiring line m4 are placed. In the cell B, the presence of the metal wiring lines d10 and d11 determines the line-to-line space S7 for the metal wiring line m8. Therefore, the same effect as described above with respect to the metal wiring lines d8 and d9 is achieved by the metal wiring lines d6, d7, d10, and d11.

Figure 8:
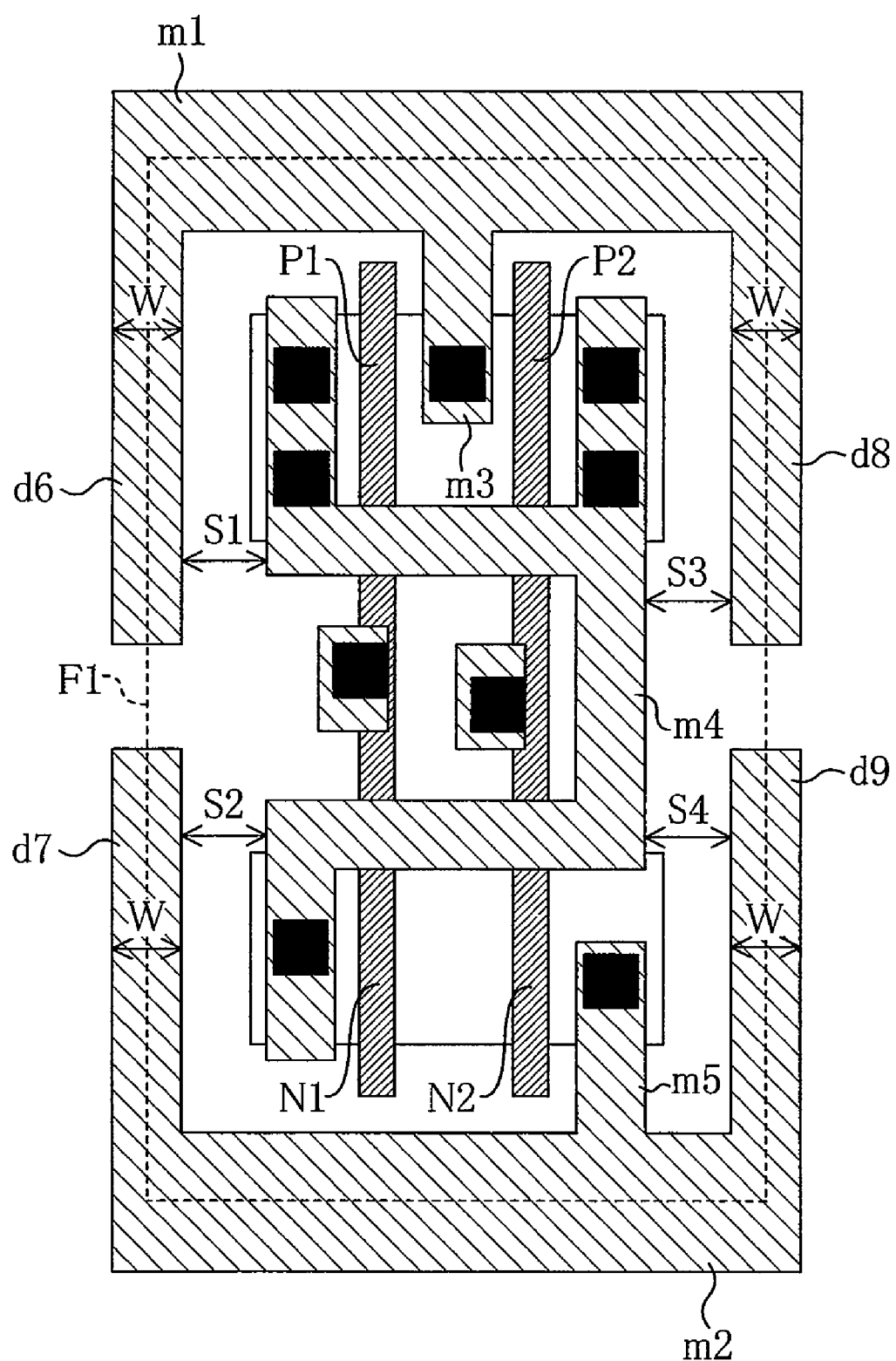
FIG. 8 is a view showing a structure of a standard cell for obtaining the layout of FIG. 7.

FIG. 8 is a view showing a structure of the cell A for obtaining the layout structure of FIG. 7. In the cell A shown in FIG. 8, the metal wiring lines d6, d7, d8, and d9 are placed over the cell frame F1. In the case of a cell as shown in FIG. 8, the metal wiring lines d6, d7, d8, and d9 are shared by adjacent cells.

Figure 9:
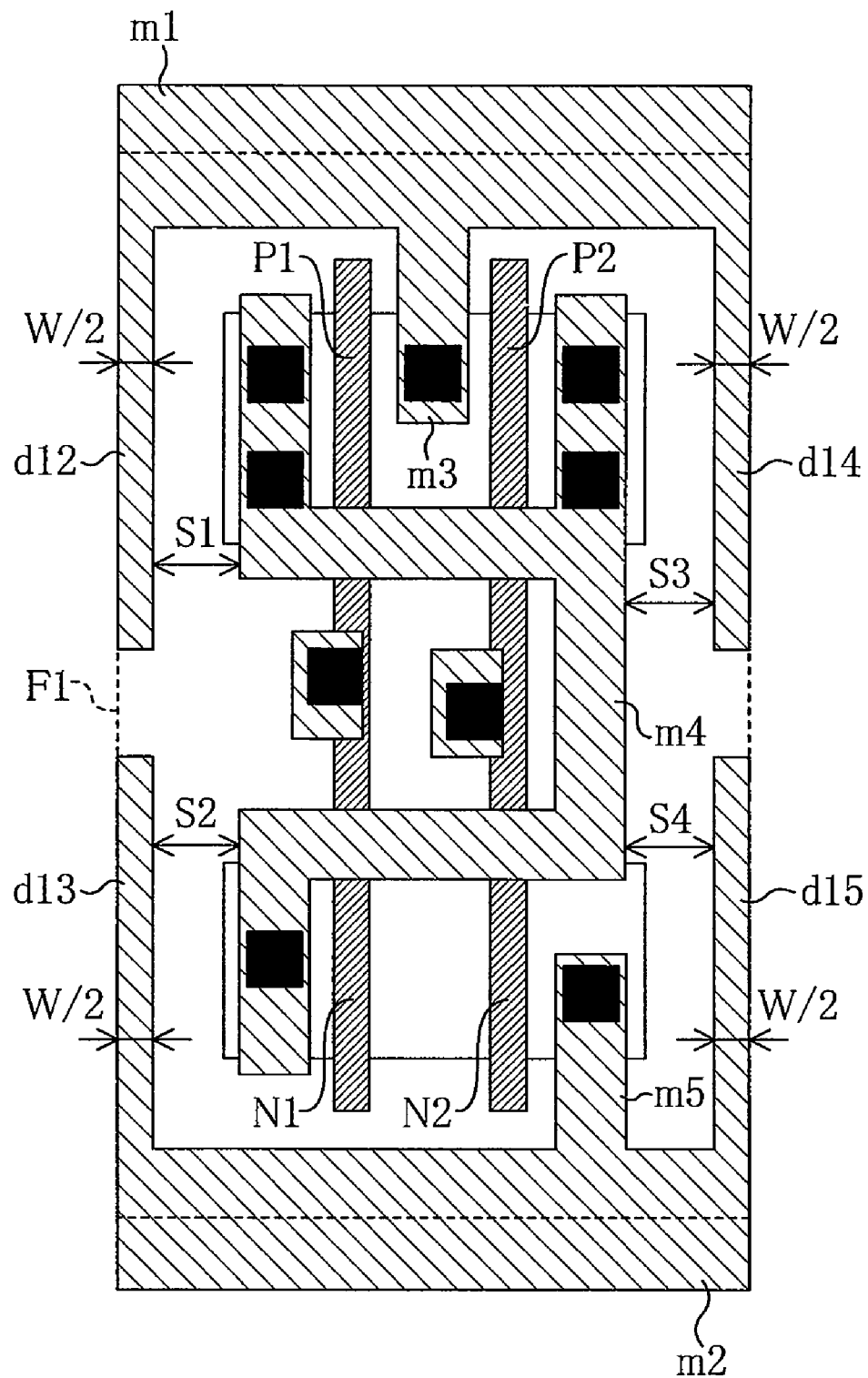
FIG. 9 is a view showing another structure of the standard cell for obtaining the layout of FIG. 7.

FIG. 9 is a view showing another structure of the cell A for obtaining the layout structure of FIG. 7. In the cell A shown in FIG. 9, metal wiring lines d12, d13, d14, and d15 each having a shape obtained by omitting, from the metal wiring lines d6, d7, d8, and d9, the portions thereof located outside the cell frame F1 in FIG. 8 are placed. The line width of each of the metal wiring lines d6, d7, d8, and d9 is W/2. By placing a cell as shown in FIG. 9 in adjacent relation to cells each having the same structure, metal wiring lines each having the line width W are placed in the boundary portions between the individual cells.

Figure 10:
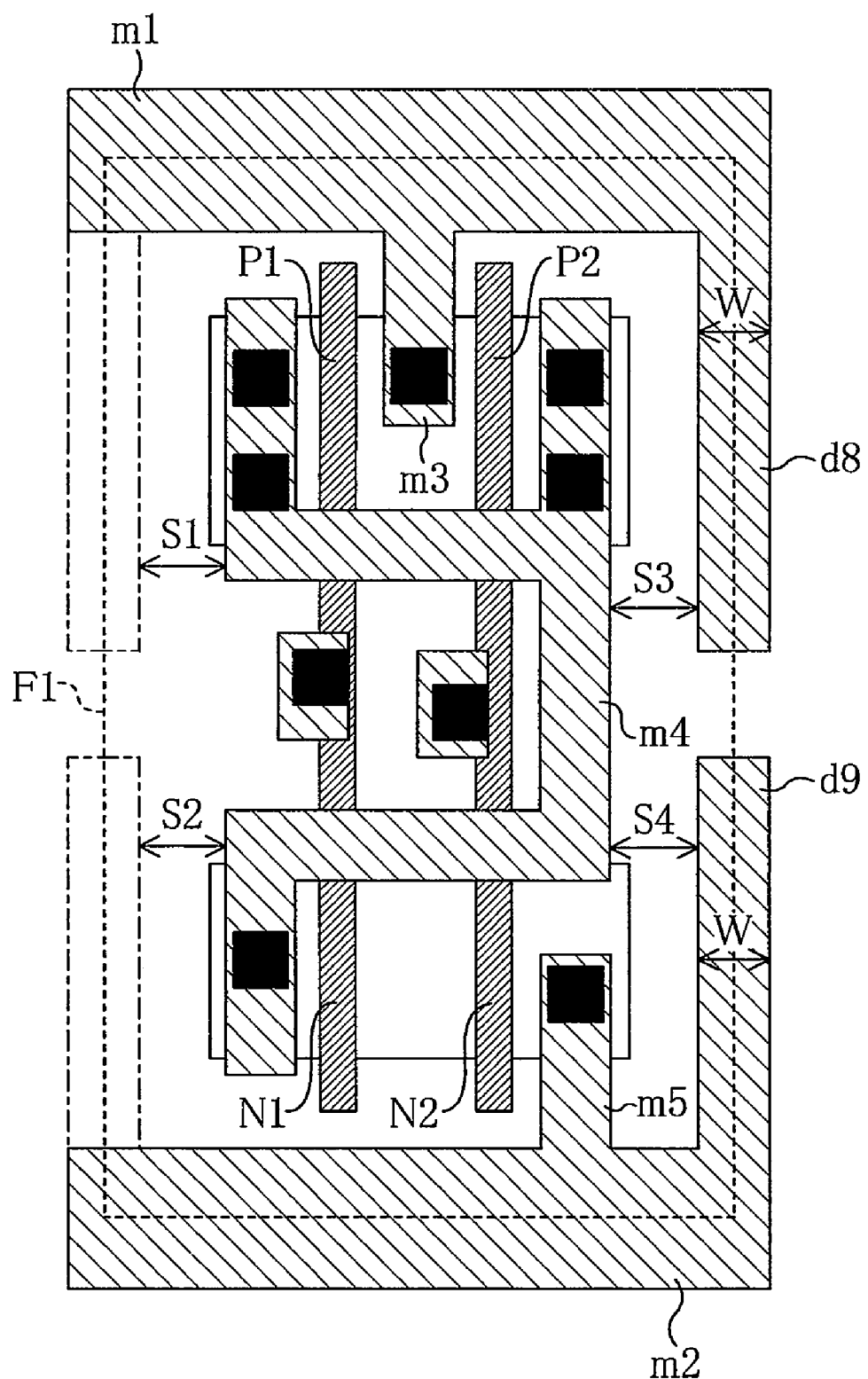
FIG. 10 is a view showing still another structure of the standard cell for obtaining the layout of FIG. 7.

FIG. 10 is a view showing still another structure of the cell A for obtaining the layout structure of FIG. 7. In the cell A shown in FIG. 10, the metal wiring lines d6 and d7 in FIG. 8 are omitted, and only the metal wiring lines d8 and d9 are placed. By placing a cell as shown in FIG. 10 in adjacent relation to a cell having the same structure, the metal wiring lines are placed in the boundary portions on both sides of the cell.

(Embodiment 3)

Figure 11:
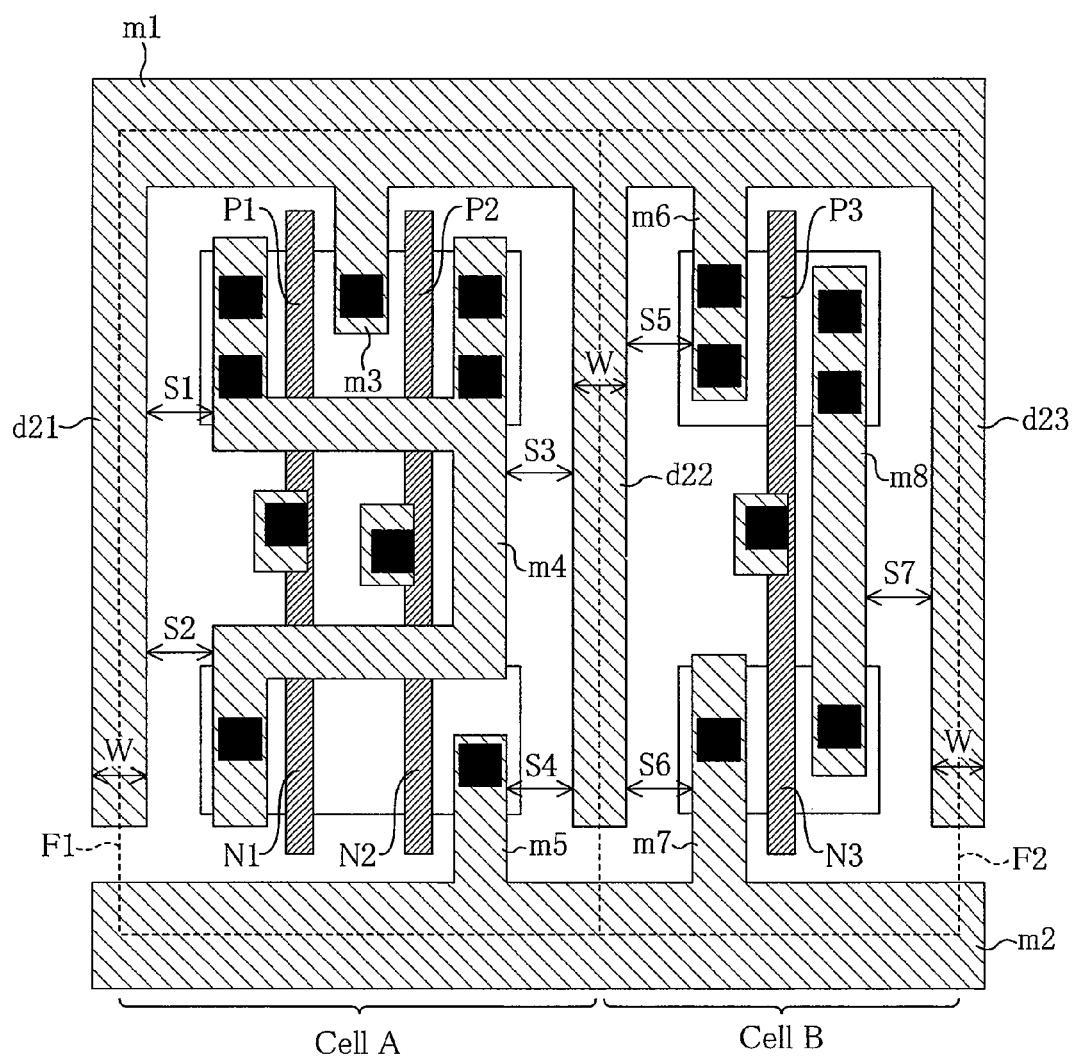
FIG. 11 is a layout plan view showing a structure of a semiconductor integrated circuit device according to a third embodiment.

FIG. 11 is a layout plan view showing a structure of a semiconductor integrated circuit device according to a third embodiment. In FIG. 11, the structures of the power supply line m1, the ground line m2, and the cells A and B are the same as in FIG. 1. Components common to those shown in FIG. 1 are provided with the same reference numerals as used in FIG. 1, and a detailed description thereof is omitted herein.

In the structure of FIG. 11, a metal wiring line d22 extending in the second direction (vertical direction in the drawing) orthogonal to the first direction is placed so as not to short-circuit the power supply line m1 and the ground line m2. That is, the metal wiring line d22 is formed to protrude from the power supply line m1, and extend to the vicinity of the ground line m2, but is not connected to the ground line m2. The metal wiring line d22 is formed in the same wiring layer in which the power supply line m1, the ground line m2, and the intra-cell lines m3 to m8 are formed. The line width of the metal wiring line d22 is W, and the center line thereof corresponds to the cell frame F1 of the cell A and to the cell frame F2 of the cell B.

Since the metal wiring line d22 is placed in the boundary portion between the cells A and B, a distance to a proximate line region from a line region closest to the boundary portion, i.e., from a line region having no other line region between itself and the boundary portion is determined irrespective of the structure of an adjacent cell. That is, in the cell A, the line-to-line space S3 is determined for a region where a portion (portion connected to the drain of the PMOS transistor P2) of the metal wiring line m4 is placed, and the line-to-line space S4 is determined for the metal wiring line m5. In the cell B, the line-to-line space S5 is determined for the metal wiring line m6, and the line-to-line space S6 is determined for the metal wiring line m7.

Thus, in the case where the cells A and B are placed in adjacent relation, the placement of the metal wiring line d22 in the boundary portion therebetween determines the line-to-line space for the line region closest to the boundary portion, irrespective of the structure of an adjacent cell. In other words, the metal wiring lines m4 and m5 within the cell A and the metal wiring lines m6 and m7 within the cell B do not affect each other in terms of the optical proximity effect. As a result, in the same manner as in the first embodiment, it is sufficient to perform OPC correction for correcting a line width only with respect to each individual cell, and it is unnecessary to perform OPC correction again for compensating for influence from an adjacent cell after cell placement. As a result, it is possible to prevent the thinning of the metal wiring line closest to a cell boundary and wire breakage therein without involving increases in the amount of data for OPC correction and OPC process time.

Additionally, in the present embodiment, the metal wiring line d22 placed in the boundary portion between the cells is connected to the power supply line m1 so that the potential of the metal wiring line d22 is fixed. As a result, the metal wiring line d22 performs the function of a so-called shield. This allows a reduction in the influence of cross-talk from an adjacent cell.

In the structure of FIG. 11, metal wiring lines d21 and d23 are placed even in the respective boundary portions of the cells A and B on the side opposite to the boundary portion where the metal wiring line d22 is placed. The metal wiring lines d21 and d23 are each formed to protrude from the power supply line m1, and extend to the vicinity of the ground line m2, but is not connected to the ground line m2. The metal wiring lines d21 and d23 are also formed in the same wiring layer in which the power supply line m1, the ground line m2, and the intra-cell lines m3 to m8 are formed. The line width of each of the metal wiring lines d21 and d23 is W, and the center lines thereof respectively correspond to the cell frame F1 of the cell A and the cell frame F2 of the cell B.

In the cell A, the presence of the metal wiring line d21 determines the line-to-line spaces S1 and S2 for regions where portions (portions connected to the respective drains of the PMOS transistor P1 and the NMOS transistor N1) of the metal wiring line m4 are placed. In the cell B, the presence of the metal wiring line d23 determines the line-to-line space S7 for the metal wiring line m8. Therefore, the same effect as described above with respect to the metal wiring line d22 is achieved by the metal wiring lines d21 and d23.

Figure 12:
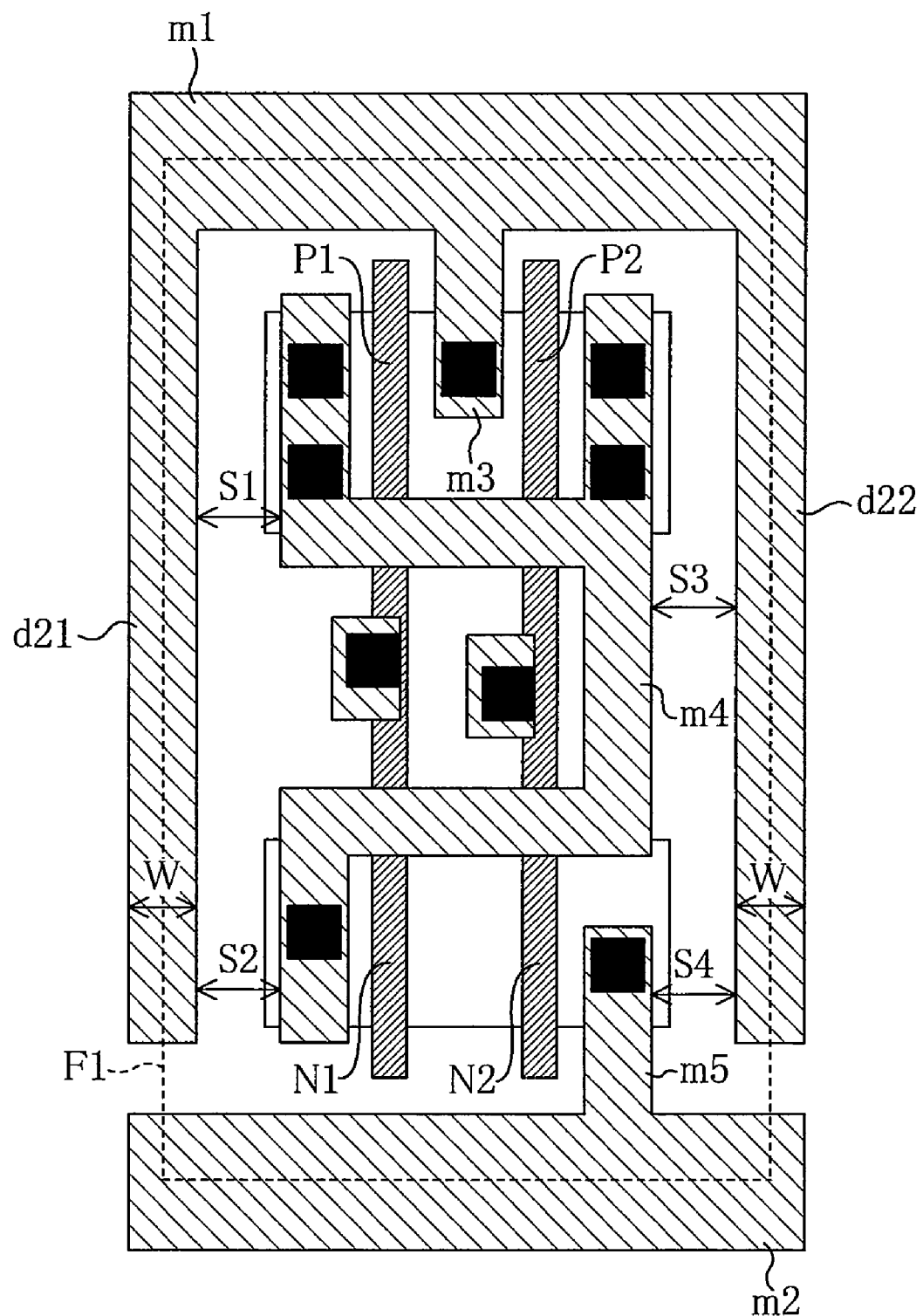
FIG. 12 is a view showing a structure of a standard cell for obtaining the layout of FIG. 11.

FIG. 12 is a view showing a structure of the cell A for obtaining the layout structure of FIG. 11. In the cell A shown in FIG. 12, the metal wiring lines d21 and d22 are placed over the cell frame F1. In the case of a cell as shown in FIG. 12, the metal wiring lines d21 and d22 are shared by adjacent cells.

Figure 13:
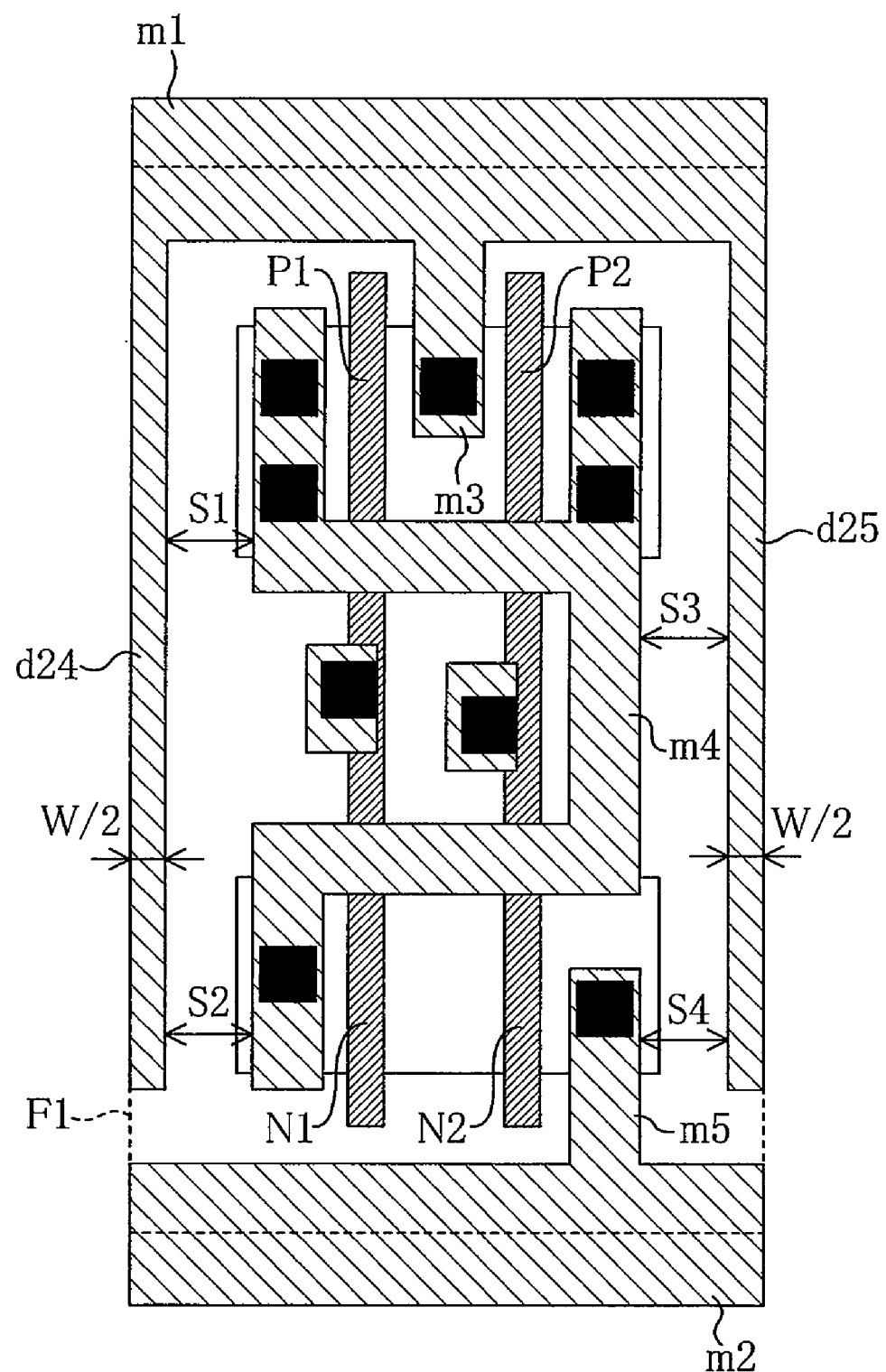
FIG. 13 is a view showing another structure of the standard cell for obtaining the layout of FIG. 11.

FIG. 13 is a view showing another structure of the cell A for obtaining the layout structure of FIG. 11. In the cell A shown in FIG. 13, metal wiring lines d24 and d25 each having a shape obtained by omitting, from the metal wiring lines d21 and d22, the portions thereof located outside the cell frame F1 in FIG. 12 are placed. The line width of each of the metal wiring lines d24 and d25 is W/2. By placing a cell as shown in FIG. 13 in adjacent relation to cells each having the same structure, metal wiring lines each having the line width W are placed in the boundary portions between the individual cells.

Figure 14:
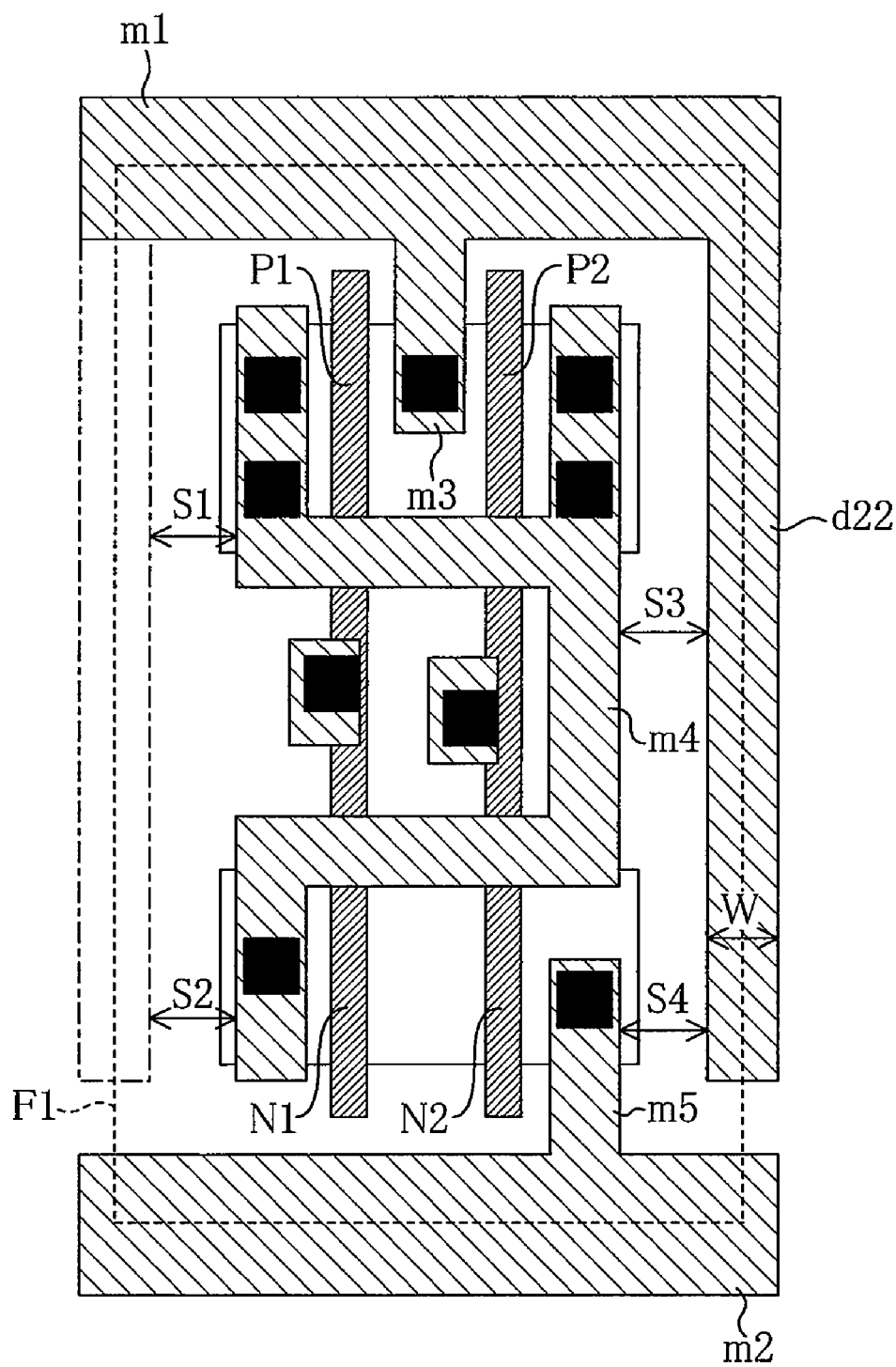
FIG. 14 is a view showing still another structure of the standard cell for obtaining the layout of FIG. 11.

FIG. 14 is a view showing another structure of the cell A for obtaining the layout structure of FIG. 11. In the cell A shown in FIG. 14, the metal wiring line d21 in FIG. 12 is omitted, and only the metal wiring line d22 is placed. By placing a cell as shown in FIG. 14 in adjacent relation to a cell having the same structure, the metal wiring lines are placed in the boundary portions on both sides of the cell.

(Embodiment 4)

Figure 15:
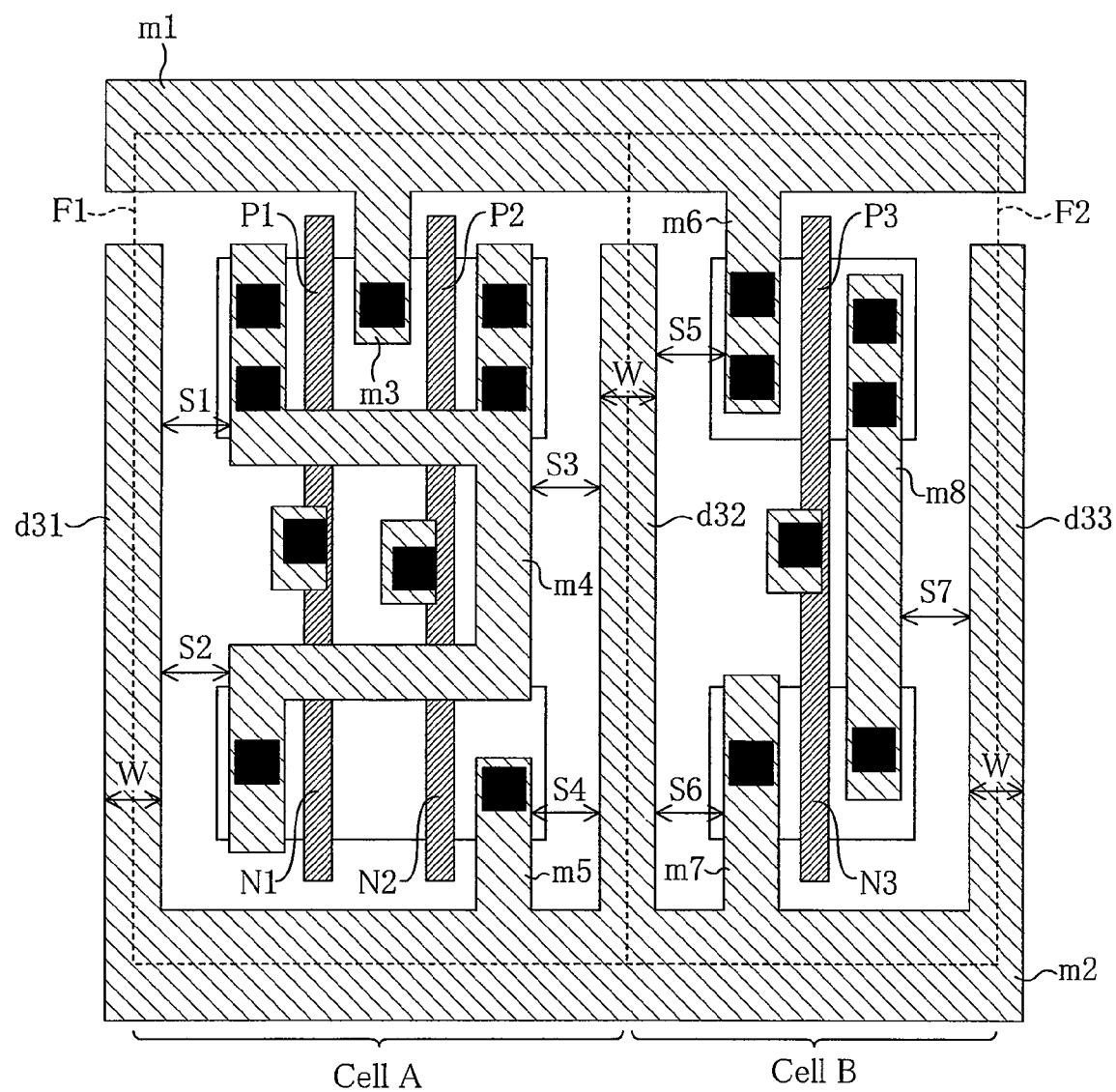
FIG. 15 is a layout plan view showing a structure of a semiconductor integrated circuit device according to a fourth embodiment.

FIG. 15 is a layout plan view showing a structure of a semiconductor integrated circuit device according to a fourth embodiment. In FIG. 15, the structures of the power supply line m1, the ground line m2, and the cells A and B are the same as in FIG. 1. Components common to those shown in FIG. 1 are provided with the same reference numerals as used in FIG. 1, and a detailed description thereof is omitted herein.

In the structure of FIG. 15, a metal wiring line d32 extending in the second direction (vertical direction in the drawing) orthogonal to the first direction is placed so as not to short-circuit the power supply line m1 and the ground line m2. That is, the metal wiring line d32 is formed to protrude from the ground line m2, and extend to the vicinity of the power supply line m1, but is not connected to the power supply line m1. The metal wiring line d32 is formed in the same wiring layer in which the power supply line m1, the ground line m2, and the intra-cell lines m3 to m8 are formed. The line width of the metal wiring line d32 is W, and the center line thereof corresponds to the cell frame F1 of the cell A and to the cell frame F2 of the cell B.

Since the metal wiring line d32 is placed in the boundary portion between the cells A and B, a distance to a proximate line region from a line region closest to the boundary portion, i.e., from a line region having no other line region between itself and the boundary portion is determined irrespective of the structure of an adjacent cell. That is, in the cell A, the line-to-line space S3 is determined for a region where a portion (portion connected to the drain of the PMOS transistor P2) of the metal wiring line m4 is placed, and the line-to-line space S4 is determined for the metal wiring line m5. In the cell B, the line-to-line space S5 is determined for the metal wiring line m6, and the line-to-line space S6 is determined for the metal wiring line m7.

Thus, in the case where the cells A and B are placed in adjacent relation, the placement of the metal wiring line d32 in the boundary portion therebetween determines the line-to-line space for the line region closest to the boundary portion, irrespective of the structure of an adjacent cell. In other words, the metal wiring lines m4 and m5 within the cell A and the metal wiring lines m6 and m7 within the cell B do not affect each other in terms of the optical proximity effect. As a result, in the same manner as in the first embodiment, it is sufficient to perform OPC correction for correcting a line width only with respect to each individual cell, and it is unnecessary to perform OPC correction again for compensating for influence from an adjacent cell after cell placement. As a result, it is possible to prevent the thinning of the metal wiring line closest to a cell boundary and wire breakage therein without involving increases in the amount of data for OPC correction and OPC process time.

Additionally, in the present embodiment, the metal wiring line d32 placed in the boundary portion between the cells is connected to the ground line m2 so that the potential of the metal wiring line d32 is fixed. As a result, the metal wiring line d32 performs the function of a so-called shield. This allows a reduction in the influence of cross-talk from an adjacent cell.

In the structure of FIG. 15, metal wiring lines d31 and d33 are placed even in the respective boundary portions of the cells A and B on the side opposite to the boundary portion where the metal wiring line d32 is placed. The metal wiring lines d31 and d33 are each formed to protrude from the ground line m2, and extend to the vicinity of the power supply line m1, but is not connected to the power supply line m1. The metal wiring lines d31 and d33 are also formed in the same wiring layer in which the power supply line m1, the ground line m2, and the intra-cell lines m3 to m8 are formed. The line width of each of the metal wiring lines d31 and d33 is W, and the center lines thereof respectively correspond to the cell frame F1 of the cell A and the cell frame F2 of the cell B.

In the cell A, the presence of the metal wiring line d31 determines the line-to-line spaces S1 and S2 for regions where portions (portions connected to the respective drains of the PMOS transistor P1 and the NMOS transistor N1) of the metal wiring line m4 are placed. In the cell B, the presence of the metal wiring line d33 determines the line-to-line space S7 for the metal wiring line m8. Therefore, the same effect as described above with respect to the metal wiring line d32 is achieved by the metal wiring lines d31 and d33.

Figure 16:
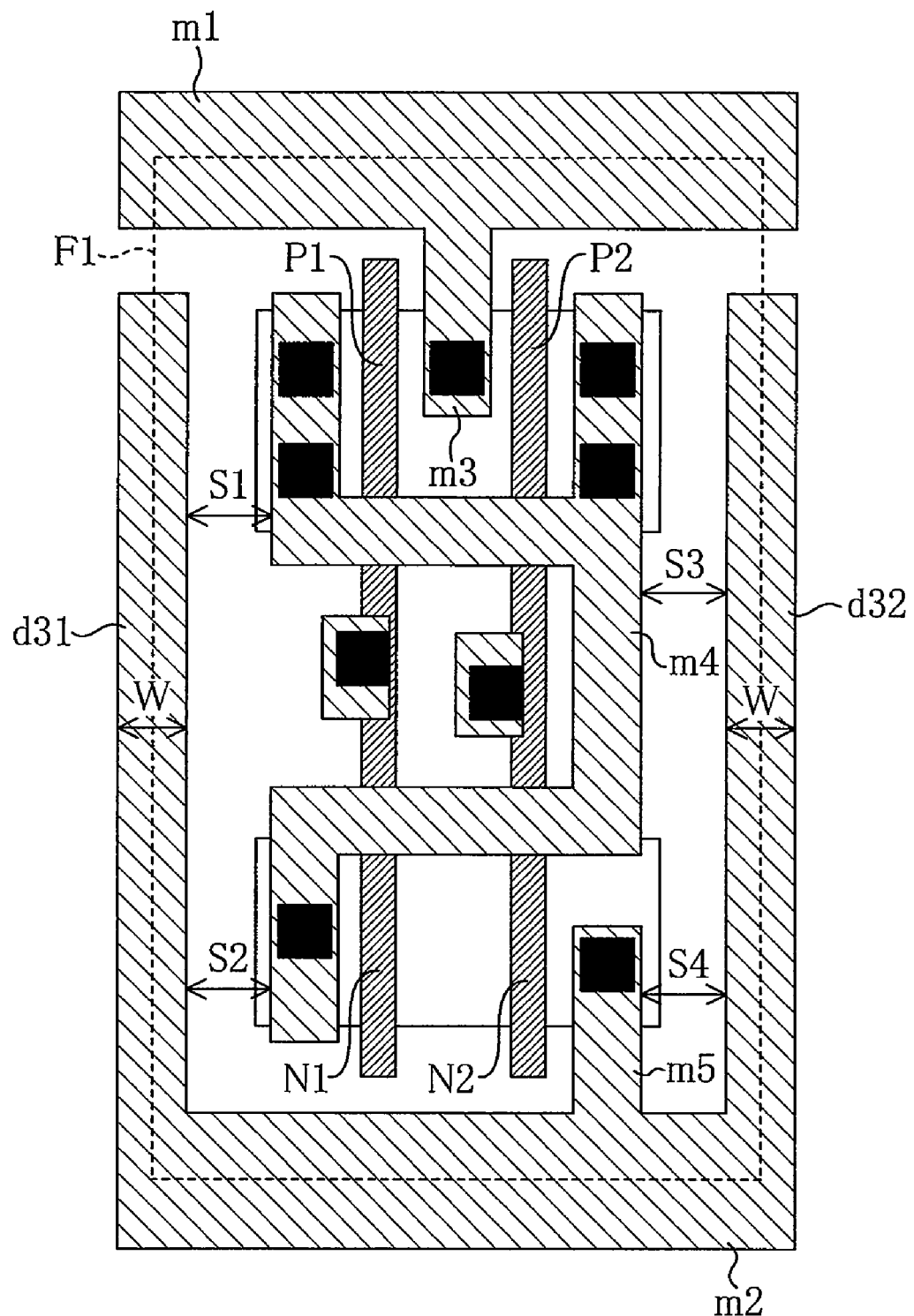
FIG. 16 is a view showing a structure of a standard cell for obtaining the layout of FIG. 15.

FIG. 16 is a view showing a structure of the cell A for obtaining the layout structure of FIG. 15. In the cell A shown in FIG. 16, the metal wiring lines d31 and d32 are placed over the cell frame F1. In the case of a cell as shown in FIG. 16, the metal wiring lines d31 and d32 are shared by adjacent cells.

Figure 17:
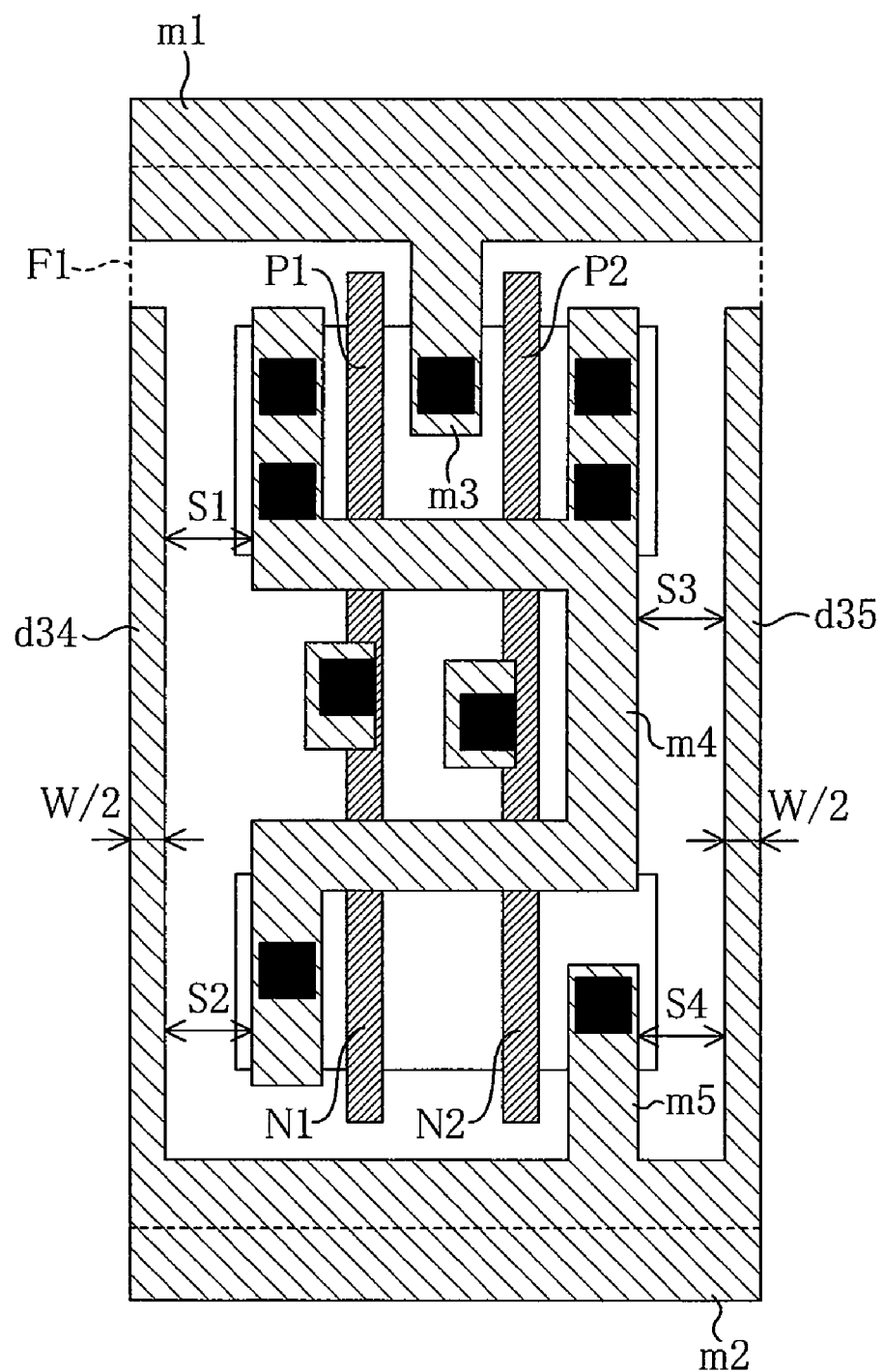
FIG. 17 is a view showing another structure of the standard cell for obtaining the layout of FIG. 15.

FIG. 17 is a view showing another structure of the cell A for obtaining the layout structure of FIG. 15. In the cell A shown in FIG. 17, metal wiring lines d34 and d35 each having a shape obtained by omitting, from the metal wiring lines d31 and d32, the portions thereof located outside the cell frame F1 in FIG. 16 are placed. The line width of each of the metal wiring lines d34 and d35 is W/2. By placing a cell as shown in FIG. 17 in adjacent relation to cells each having the same structure, metal wiring lines each having the line width W are placed in the boundary portions between the individual cells.

Figure 18:
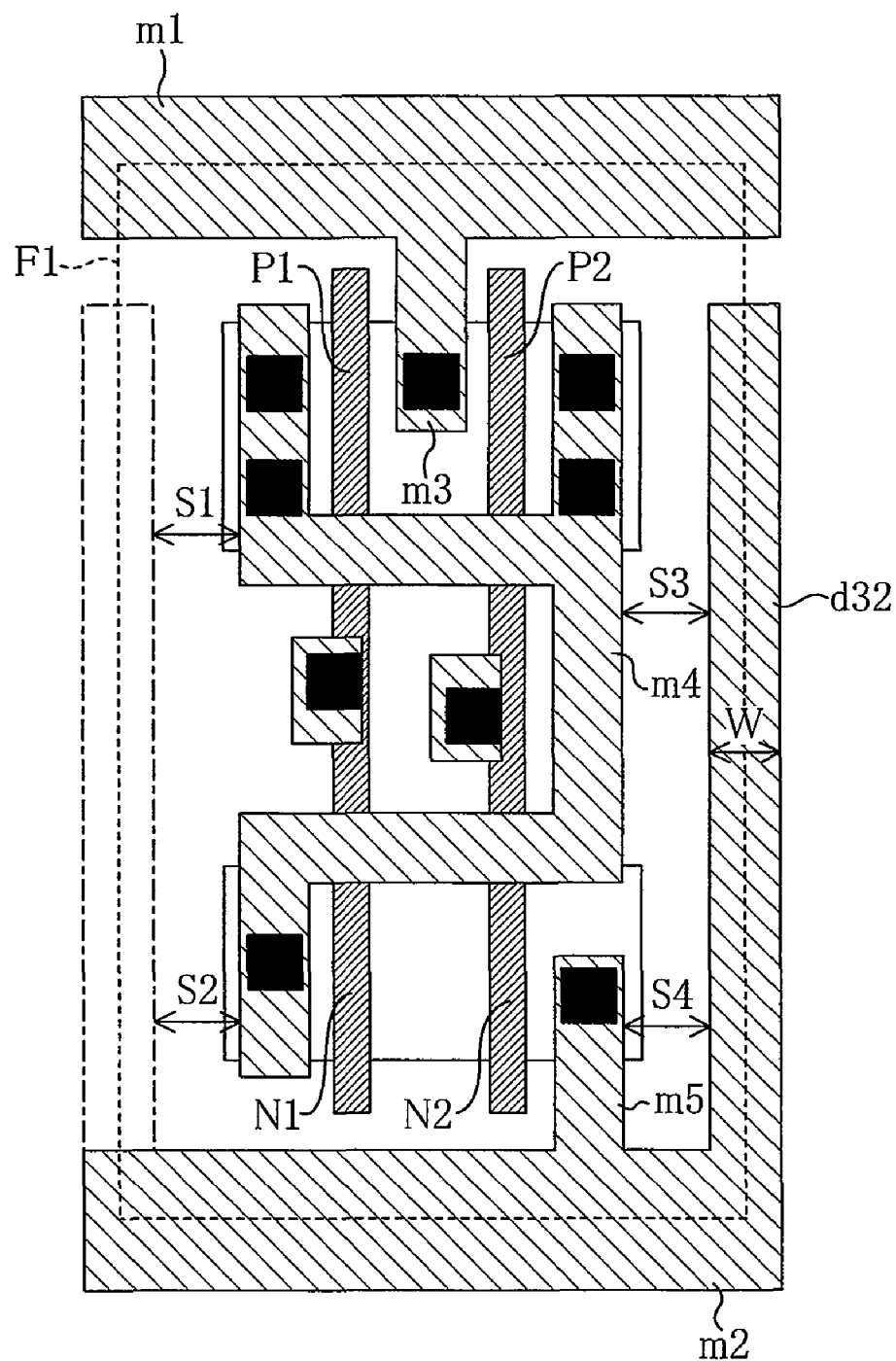
FIG. 18 is a view showing still another structure of the standard cell for obtaining the layout of FIG. 15.

FIG. 18 is a view showing another structure of the cell A for obtaining the layout structure of FIG. 15. In the cell A shown in FIG. 18, the metal wiring line d31 in FIG. 16 is omitted, and only the metal wiring line d32 is placed. By placing a cell as shown in FIG. 18 in adjacent relation to a cell having the same structure, the metal wiring lines are placed in the boundary portions on both sides of the cell.

(Variations)

In the second to fourth embodiments, each of the metal wiring lines placed in the boundary portions between the cells may also be composed of a plurality of small sections.

Figure 19:
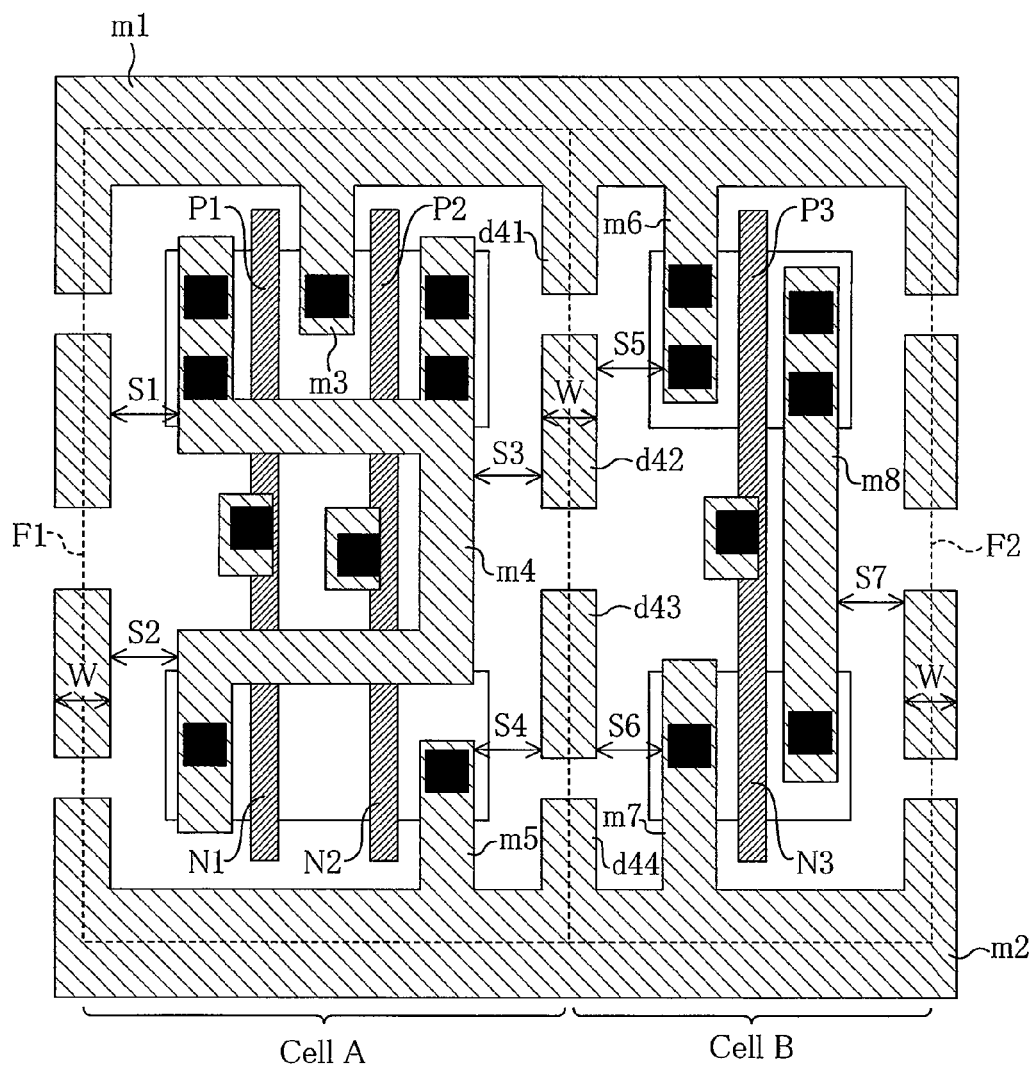
FIG. 19 is a layout plan view showing a variation of the semiconductor integrated circuit device according to the second embodiment.

For instance, in the example shown in FIG. 19, the metal wiring line composed of a plurality of small sections d41, d42, d43, and d44 is placed in the boundary portion between the cells A and B. The small section d41 is connected to the power supply line m1, while the small section d44 is connected to the ground line m2. The small sections d42 and d43 are dummy lines.

Figure 20:
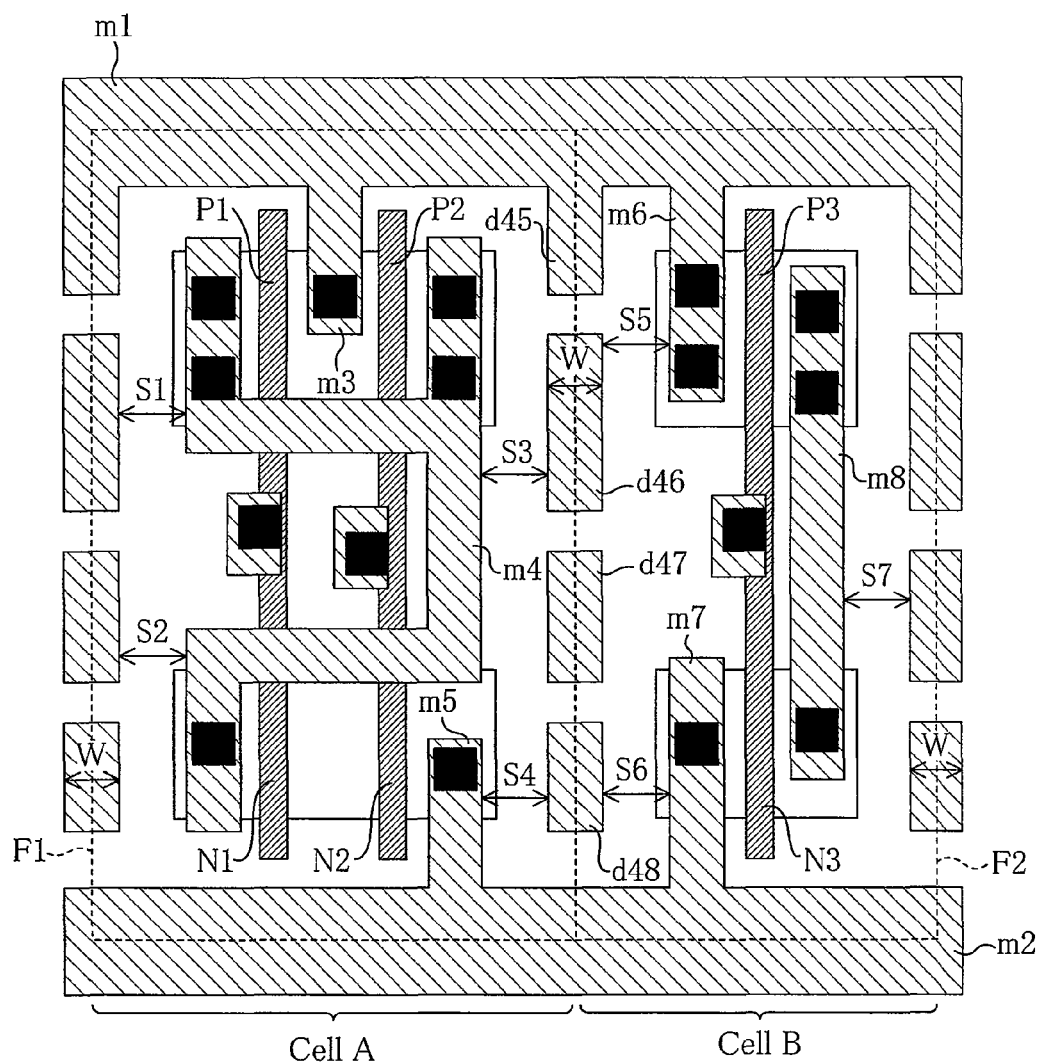
FIG. 20 is a layout plan view showing a variation of the semiconductor integrated circuit device according to the third embodiment.

In the example shown in FIG. 20, the metal wiring line composed of a plurality of small sections d45, d46, d47, and d48 is placed in the boundary portion between the cells A and B. The small section d45 is connected to the power supply line m1. The small sections d46, d47, and d48 are dummy lines.

Figure 21:
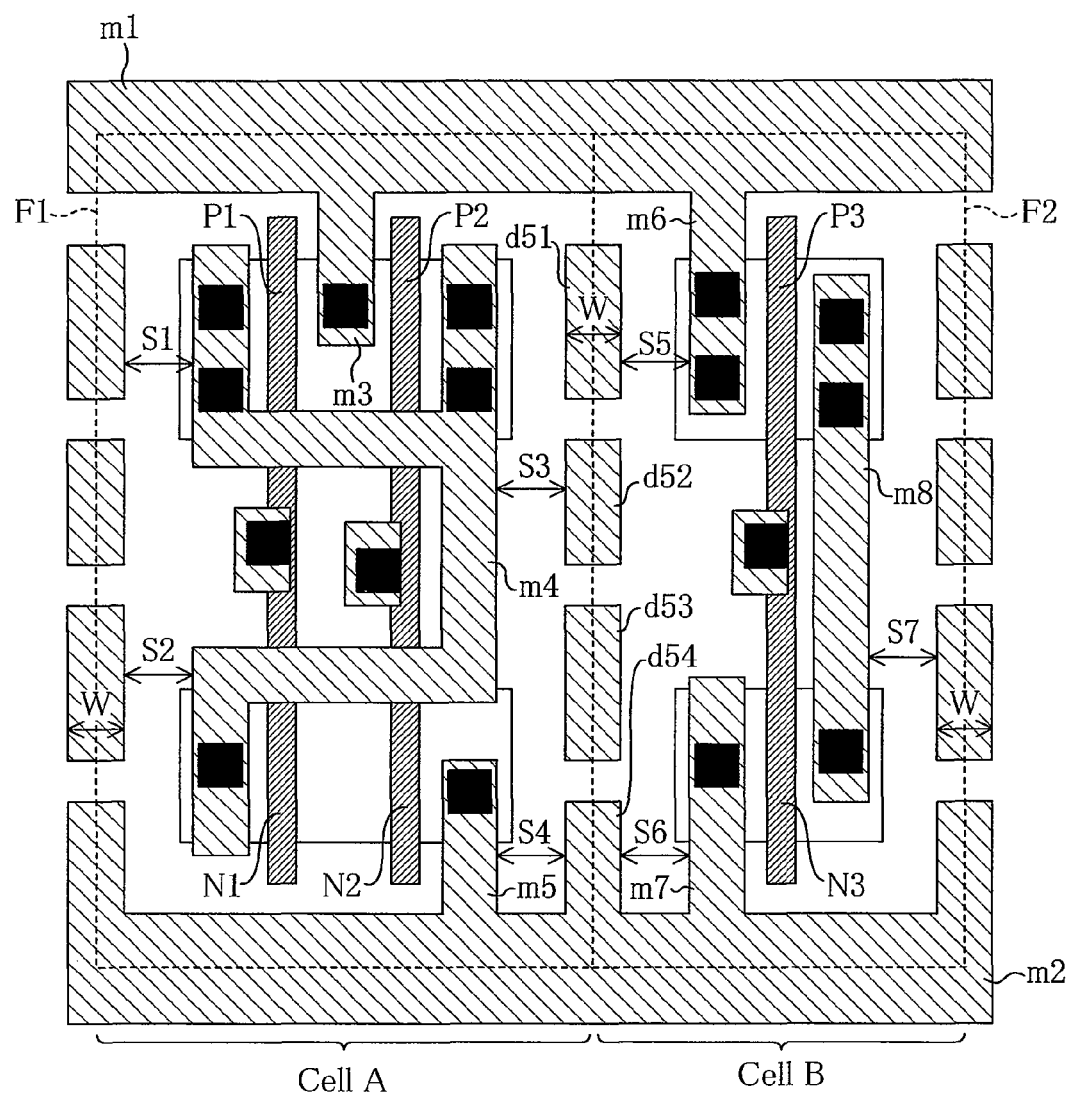
FIG. 21 is a layout plan view showing a variation of the semiconductor integrated circuit device according to the fourth embodiment.

In the example shown in FIG. 21, the metal wiring line composed of a plurality of small sections d51, d52, d53, and d54 is placed in the boundary portion between the cells A and B. The small section d54 is connected to the ground line m2. The small sections d51, d52, and d53 are dummy lines.

The space between the individual sections preferably has a small dimension which allows the small sections to be regarded as being substantially connected in terms of the optical proximity effect, but may also be larger than the dimension. In each of the examples shown in FIGS. 19 to 21, the metal wiring lines placed in the respective boundary portions are each composed of the same number of small sections, and the spaces therebetween are substantially at the same position. However, the numbers of the small sections composing the metal lines, and the positions of the spaces therebetween may also be different from each other.

Industrial Applicability

In the present invention, it is possible to prevent the thinning of a metal wiring line closest to a cell boundary and wire breakage therein without involving increases in the amount of data for OPC correction and OPC process time. Therefore, the present invention is useful in improving the yield of a semiconductor integrated circuit mounted in various electronic equipment, reducing cost, and reducing a development period.

The invention claimed is:

1. A semiconductor integrated circuit device comprising:
   a power supply line and a ground line each placed to extend in a first direction; and
   first and second cells placed in a region interposed between the power supply line and the ground line to be adjacent to each other in the first direction, and each having a transistor and an intra-cell line each for implementing a circuit function, wherein
   a dummy metal wiring line extending in a second direction orthogonal to the first direction is placed in a boundary portion between the first and second cells so as not to short-circuit the power supply line and the ground line,
   a first metal wiring line in the first cell has a portion parallel with the dummy metal wiring line, the portion being connected with source or drain of a transistor and closest to the boundary portion between the first and second cells among the intra-cell line in the first cell, and
   the first metal wiring line and the dummy metal wiring line are formed in a same wiring layer.

2. The semiconductor integrated circuit device of claim 1, wherein the dummy metal wiring line is in a floating state which is not connected to either of the power supply line and the ground line.

3. The semiconductor integrated circuit device of claim 1, wherein the dummy metal wiring line includes a first line formed to protrude from the power supply line, and a second line formed to protrude from the ground line, and unconnected to the first line.

4. The semiconductor integrated circuit device of claim 1, wherein the dummy metal wiring line is formed to protrude from the power supply line, and unconnected to the ground line.

5. The semiconductor integrated circuit device of claim 1, wherein the dummy metal wiring line is formed to protrude from the ground line, and unconnected to the power supply line.

6. The semiconductor integrated circuit device of claim 1, wherein the dummy metal wiring line includes a plurality of small sections.

7. The semiconductor integrated circuit device of claim 6, wherein one of the plurality of small sections is connected to the power supply line.

8. The semiconductor integrated circuit device of claim 6, wherein one of the plurality of small sections is connected to the ground line.

9. The semiconductor intergrated circuit device of claim 1, wherein the first metal wiring line has another portion perpendicular to the dummy metal wiring line.

10. A semiconductor integrated circuit device comprising:
    a power supply line and a ground line each placed to extend in a first direction; and
    first and second cells place in region interposed between the power supply line and the ground line to be adjacent to each other in the first direction, and each having a transistor and an intra-cell line each for implementing a circuit fuction, wherein
    a dummy metal wiring line formed on a different layer than a gate of the transistor of the first and second cells and extending in a second direction orthogonal to the first direction is placed in a boundary portion between the first and second cells so as not to short-circuit the power supply line and the ground line,
    a first metal wiring line in the first cell has a portion parallel with the dummy metal wiring line, the portion being connected with source or drain of a transistor and closest to the boundary portion between the first and second cells amoung the intra-cell line in the first cell, and
    the first metal wiring line and the dummy metal wiring line are formed in a same wiring layer.

11. The semiconductor integrated circuit device of claim 10, wherein the dummy metal wiring line is in a floating state which is not connected to either of the power supply line and the ground line.

12. The semiconductor integrated circuit device of claim 10, wherein the dummy metal wiring line includes a first line formed to protude from the power supply line, and a second line formed to protude from the ground line, and unconnected to the first line.

13. The semiconductor integrated circuit device of claim 10, wherein the dummy metal wiring line is formed to protude from the power supply line, and unconnected to the ground line.

14. The semiconductor integrated circuit device of claim 10, wherein the dummy metal wiring line is formed to protrude from the ground line, and unconnected to the power supply line.

15. The semiconductor integrated circuit device of claim 10, wherein the dummy metal wiring line includes a plurlity of small sections.

16. The semiconductor integrated circuit device of claim 15, wherein one of the plurality of small sections is connected to the power supply line.

17. The semiconductor integrated circuit device of claim 15, wherein one of the plurity of small section is connected to the ground line.

* * * * *